United States Patent
Lee et al.

(10) Patent No.: US 9,768,129 B2
(45) Date of Patent: Sep. 19, 2017

(54) SEMICONDUCTOR DEVICE INCLUDING THREE-DIMENSIONAL CRACK DETECTION STRUCTURE

(71) Applicant: Samsung Electronics Co., Ltd., Suwon-si (KR)

(72) Inventors: Seung-Seob Lee, Suwon-si (KR); Hyuk-Joon Kwon, Yongin-si (KR); Bo-Tak Lim, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/200,523

(22) Filed: Jul. 1, 2016

(65) Prior Publication Data
US 2017/0125360 A1    May 4, 2017

(30) Foreign Application Priority Data

Nov. 2, 2015 (KR) ........................ 10-2015-0153446

(51) Int. Cl.
| | |
|---|---|
| H01L 23/48 | (2006.01) |
| H01L 23/58 | (2006.01) |
| H01L 21/66 | (2006.01) |
| H01L 23/00 | (2006.01) |
| H01L 29/49 | (2006.01) |
| H01L 23/528 | (2006.01) |

(52) U.S. Cl.
CPC ........ H01L 23/573 (2013.01); H01L 23/5283 (2013.01); H01L 23/585 (2013.01); H01L 29/4916 (2013.01)

(58) Field of Classification Search
CPC . H01L 23/573; H01L 23/5283; H01L 23/589; H01L 29/4916
USPC ......... 257/48, 457, 494, 678, 682, 620, 774, 257/E21.521, E21.523, E21.531, E23.002, 257/E23.011, E23.194, E29.012, E29.02, 257/E29.043; 438/18, 87, 613
See application file for complete search history.

(56) References Cited

U.S. PATENT DOCUMENTS

| | | | |
|---|---|---|---|
| 6,091,131 A | 7/2000 | Cook et al. | |
| 6,449,748 B1 | 9/2002 | Jeng et al. | |
| 6,475,827 B1 | 11/2002 | Lee et al. | |
| 6,555,899 B1 | 4/2003 | Chung et al. | |
| 6,649,986 B1 | 11/2003 | Ishizaki et al. | |
| 7,247,921 B2 | 7/2007 | Sugiura et al. | |

(Continued)

FOREIGN PATENT DOCUMENTS

| | | |
|---|---|---|
| KR | 0355796 B | 10/2002 |
| KR | 0355797 B | 10/2002 |

*Primary Examiner* — Dao H Nguyen
(74) *Attorney, Agent, or Firm* — Muir Patent Law, PLLC

(57) ABSTRACT

A semiconductor device includes a semiconductor die, a semiconductor integrated circuit and a three-dimensional crack detection structure. The semiconductor die includes a central region and a peripheral region surrounding the central region. The semiconductor integrated circuit is formed in the central region. The three-dimensional crack detection structure is formed in a ring shape in the peripheral region to surround the central region. The three-dimensional crack detection structure is expanded in a vertical direction. Using the three-dimensional crack detection structure, the crack penetration of various types may be detected thoroughly.

16 Claims, 26 Drawing Sheets

(56) References Cited

U.S. PATENT DOCUMENTS

| | | | |
|---|---|---|---|
| 7,649,200 B1 | 1/2010 | Miller et al. | |
| 8,624,401 B2* | 1/2014 | Ishikawa | H01L 22/34 |
| | | | 257/686 |
| 8,836,084 B2* | 9/2014 | Chen | H01L 23/585 |
| | | | 257/620 |
| 9,087,891 B2* | 7/2015 | Yoshizawa | H01L 22/34 |
| 9,287,184 B2* | 3/2016 | Dennison | H01L 22/14 |
| 9,466,562 B2* | 10/2016 | Nakazawa | H01L 23/5226 |
| 2005/0230005 A1 | 10/2005 | Liang et al. | |
| 2008/0203388 A1* | 8/2008 | He | H01L 22/32 |
| | | | 257/48 |
| 2009/0201043 A1* | 8/2009 | Kaltalioglu | G01R 31/2858 |
| | | | 324/750.3 |
| 2010/0001405 A1* | 1/2010 | Williamson | H01L 23/585 |
| | | | 257/774 |
| 2011/0141268 A1* | 6/2011 | Kumagai | G01N 21/9501 |
| | | | 348/87 |
| 2012/0205791 A1* | 8/2012 | Su | H01L 21/76898 |
| | | | 257/682 |
| 2015/0115993 A1* | 4/2015 | Wang | G01R 31/31851 |
| | | | 324/762.03 |
| 2016/0197056 A1* | 7/2016 | Bhowmik | H01L 22/34 |
| | | | 257/48 |
| 2016/0300800 A1* | 10/2016 | Zeng | H01L 23/562 |

* cited by examiner

SEMICONDUCTOR DEVICE INCLUDING THREE-DIMENSIONAL CRACK DETECTION STRUCTURE

CROSS-REFERENCE TO RELATED APPLICATION

This U.S. Non-provisional application claims the benefit of priority under 35 U.S.C. §119 to Korean Patent Application No. 10-2015-0153446, filed on Nov. 2, 2015, in the Korean Intellectual Property Office (KIPO), the disclosure of which is incorporated by reference in its entirety herein.

BACKGROUND

1. Technical Field

Example embodiments relate generally to semiconductor devices, and more particularly to semiconductor devices including a three-dimensional crack detection structure.

2. Discussion of the Related Art

In general, integrated circuits are manufactured by forming repeated patterns in a wafer of semiconductor material. The wafer may be cut or diced into a plurality of semiconductor dies, and the respective semiconductor die may be packaged into a semiconductor chip. Cracks may occur in the semiconductor die during the cutting and packaging processes. To reduce yield of defective products, the semiconductors are inspected to detect the cracks.

SUMMARY

At least one example embodiment of the present disclosure may provide a semiconductor device for enhancing detectability of crack penetration of various types.

At least one example embodiment of the present disclosure may provide a method of detecting a crack in a semiconductor device for enhancing detectability of crack penetration of various types.

According to certain embodiments, the disclosure is directed to a semiconductor device comprising: a semiconductor die including a central region and a peripheral region surrounding the central region; a semiconductor integrated circuit formed in the central region; and a three-dimensional crack detection structure formed in the peripheral region to surround the central region, the three-dimensional crack detection structure extending in a vertical direction that is perpendicular to a row direction and a column direction.

According to certain embodiments, the disclosure is directed to a semiconductor device comprising: a plurality of semiconductor dies stacked in a vertical direction, each of the semiconductor dies including a central region and a peripheral region surrounding the central region; a plurality of semiconductor integrated circuits respectively formed in the central regions of the semiconductor dies; and a three-dimensional crack detection structure formed in a ring shape in the peripheral regions of the semiconductor dies to surround the central regions, the three-dimensional crack detection structure extending in the vertical direction to cover the plurality of semiconductor dies.

According to certain embodiments, the disclosure is directed to a semiconductor device comprising: a semiconductor die including a first conduction layer and a second conduction layer below the first conduction layer and a central region and a peripheral region surrounding the central region; a semiconductor integrated circuit formed in the central region; and a three-dimensional crack detection structure formed in a ring shape in the peripheral region to surround the central region, the three-dimensional crack detection structure extending in a vertical direction that is perpendicular to a row direction and a column direction, wherein the three-dimensional crack detection structure includes a conduction loop that extends in the vertical direction between the first conduction layer and the second conduction layer.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
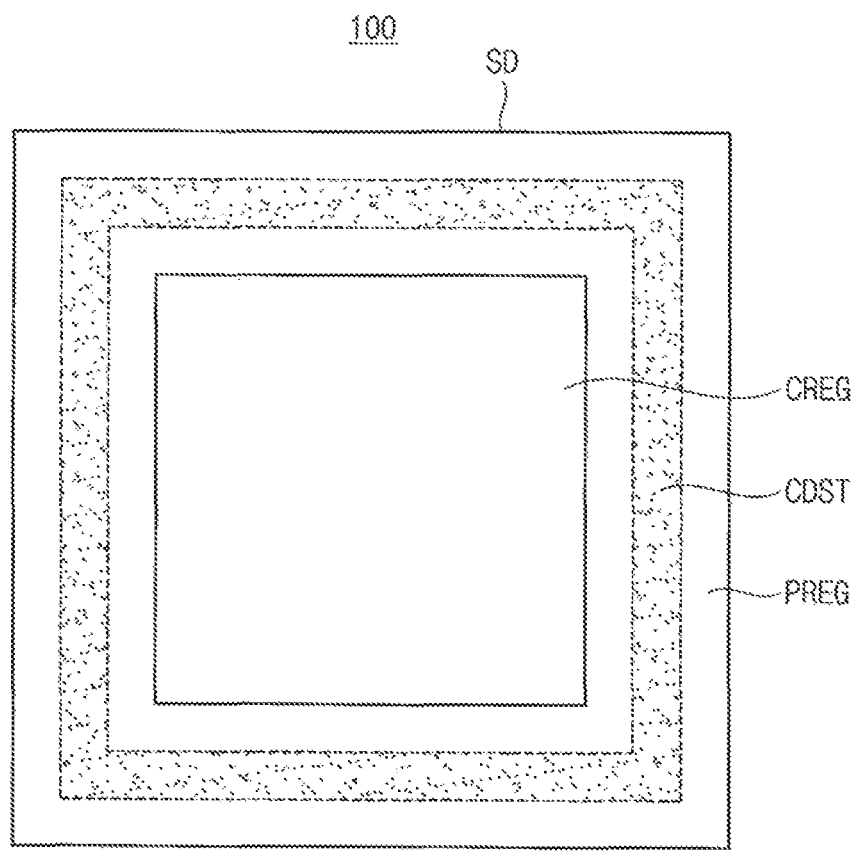
FIG. 1 is a top view illustrating a layout of a semiconductor device according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity. Like numerals refer to like elements throughout.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). The term "contact" as used herein refers to a direct connection (e.g., touching), unless the context clearly indicates otherwise.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

The semiconductor devices described herein may be a semiconductor memory chip or semiconductor logic chip, a stack of such chips, a semiconductor package including a package substrate and one or more semiconductor chips, or a package-on-package device. In the case of memory, the semiconductor device may be part of a volatile or non-volatile memory. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a top view illustrating a layout of a semiconductor device according to example embodiments.

Referring to FIG. 1, a semiconductor device 100 includes at least one semiconductor die SD. The semiconductor die SD includes a central region CREG and a peripheral region PREG.

Various semiconductor integrated circuits may be formed in the central region CREG depending on a kind or type of the semiconductor device 100. For example, the semiconductor device 100 may be semiconductor memory device and a memory integrated circuit illustrated as FIG. 11 may be formed in the central region CREG of the semiconductor die SD.

The three-dimensional crack detection structure CDST may be formed in the peripheral region PREG. The three-dimensional crack detection structure CDST may be expanded, or may extend in a vertical direction Z that is perpendicular to a row direction and a column direction, and may be formed in a ring shape in the peripheral region PREG to surround the central region CREG. For example, the three-dimensional crack detection structure CDST may have a shape that encloses or encircles the central region CREG. The three-dimensional crack detection structure CDST may extend in the vertical direction, as well as in two different horizontal directions. In some embodiments, the semiconductor die may include a first conduction layer and a second conduction layer below the first conduction layer, and portions of the first and second conduction layers may be in the central region and portions of the first and second conduction layers may be in the central and peripheral regions.

In some example embodiments, the semiconductor device 100 may include a single semiconductor die. In this case, the three-dimensional crack detection structure CDST may be expanded in the vertical direction within the single semiconductor die as illustrated in FIGS. 4, 5, 6, 15 and 16.

Figure 21:
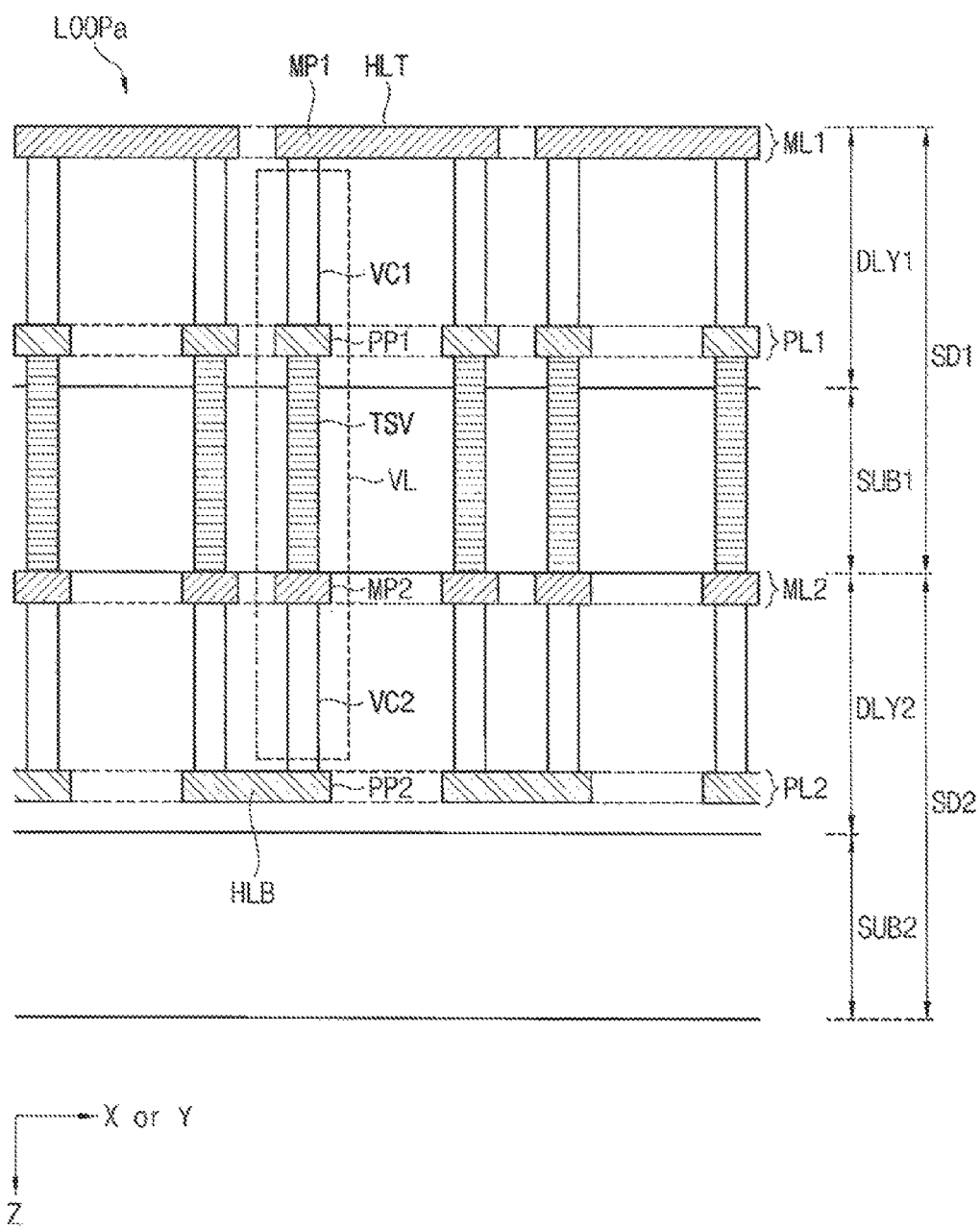
FIGS. 21 and 22 are cross-sectional diagrams illustrating a vertical structure of a three-dimensional crack detection structure according to example embodiments.
Figure 22:
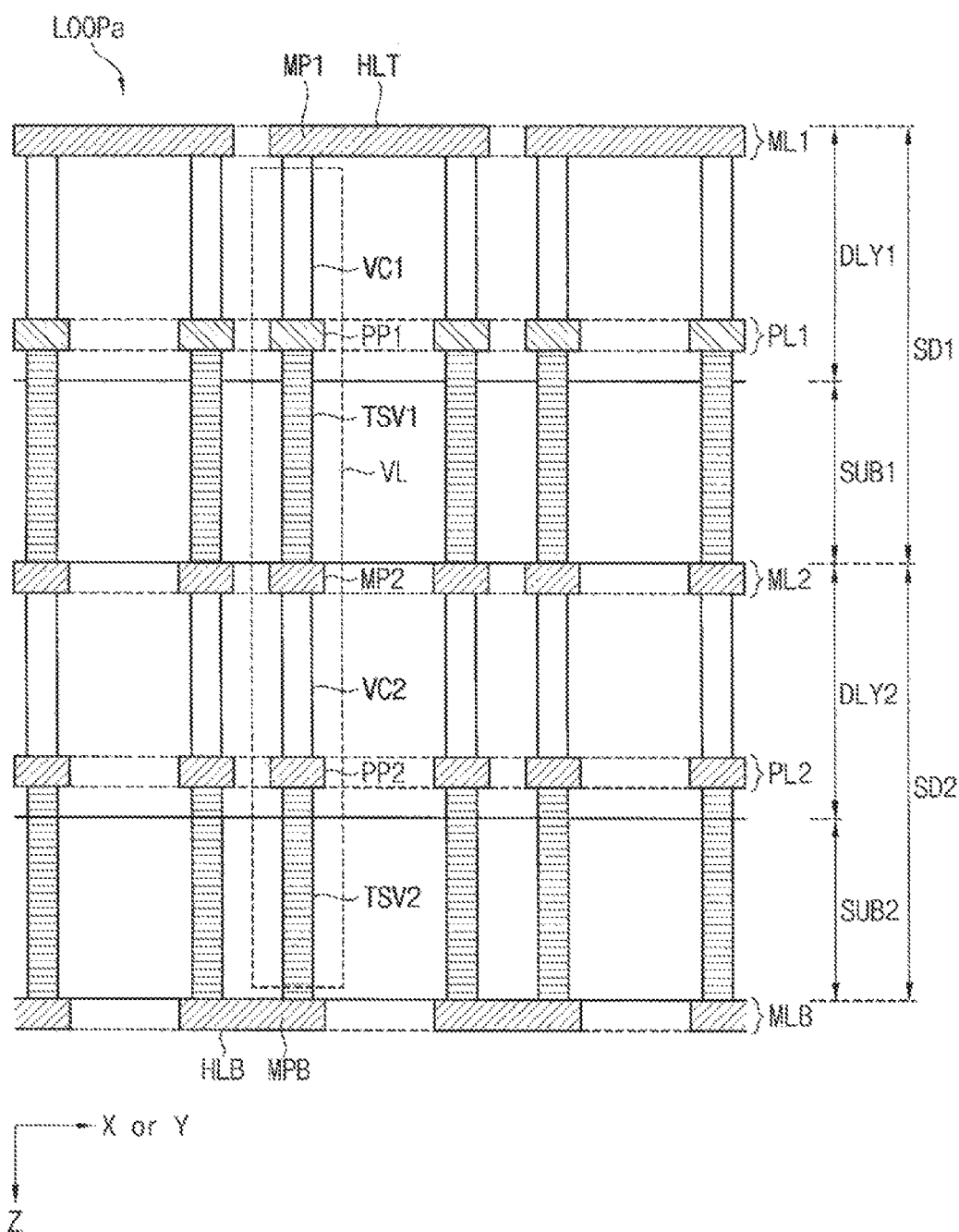

In some example embodiments, the semiconductor device 100 may include a plurality of semiconductor dies. In this case, the three-dimensional crack detection structure CDST may be expanded in the vertical direction Z to cover the plurality of the semiconductor dies as illustrated in FIGS. 21 and 22.

Figure 2A:
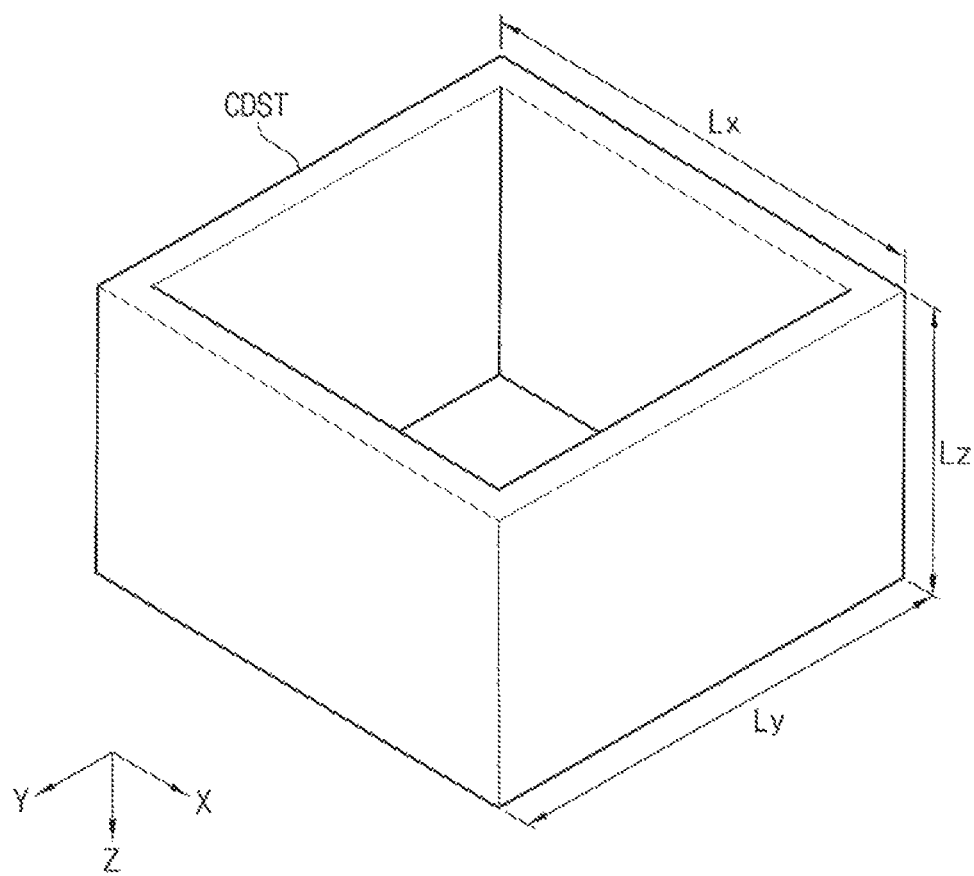
FIG. 2A is a perspective view of a three-dimensional crack detection structure included in the exemplary semiconductor device of FIG. 1.
Figure 2B:
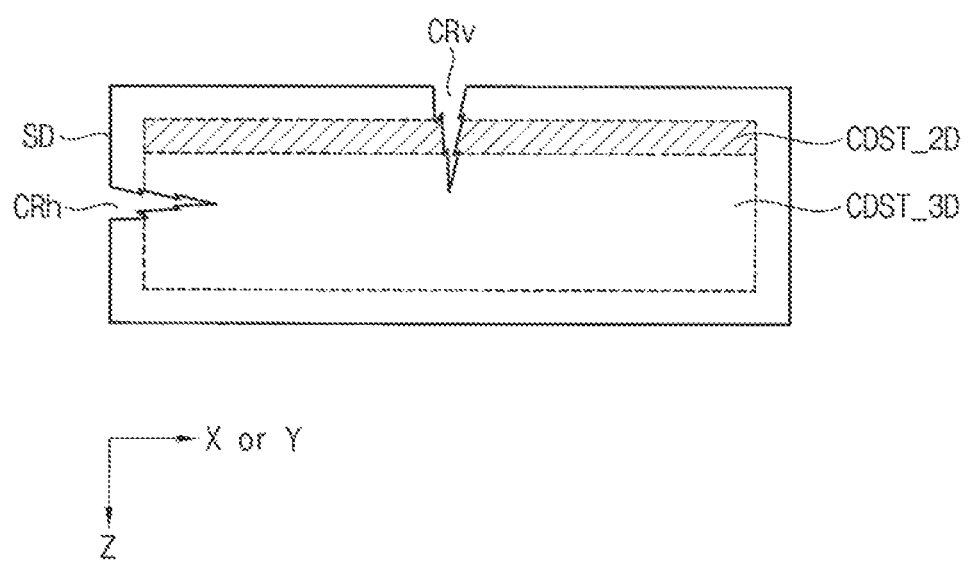
FIG. 2B is a diagram for describing crack detection by a three-dimensional crack detection structure according to example embodiments.

FIG. 2A is a perspective view of a three-dimensional crack detection structure included in the semiconductor device of FIG. 1, and FIG. 2B is a diagram for describing crack detection by a three-dimensional crack detection structure according to example embodiments.

Referring to FIG. 2A, a three-dimensional crack detection structure CDST may have lengths Lx, Ly and Lz along the row direction X, the column direction Y and the vertical direction Z, respectively. Even though FIG. 2A illustrates the three-dimensional crack detection structure CDST in a shape of a square cylinder, the three-dimensional crack detection structure CDST may be of any suitable closed shape, such as, for example, a ring shape (e.g., a circular cylinder, a pentagon cylinder, etc.), a polygon shape (e.g., rectangle, pentagon, heptagon, hexagon, etc.), and so on.

FIG. 2B shows a two-dimensional crack detection structure CDST_2D and a three-dimensional crack detection structure CDST_3D according to example embodiments.

In the conventional scheme, a vertical crack CRv may be detected using the two-dimensional crack detection structure CDST_2D penetrating a top surface of the semiconductor die SD but a horizontal crack CRh, which penetrates a side of the semiconductor die SD and does not affect the two-dimensional crack detection structure CDST_2D, cannot be detected using the two-dimensional crack detection structure CDST_2D. For example, a vertical crack CRv may be one that extends in the Z direction and penetrates a top surface of semiconductor die SD, whereas a horizontal crack CRh may be one that extends in the X and/or Y directions at a depth different from the top surface of the semiconductor die SD.

The semiconductor device according to example embodiments may detect crack penetration of various types more thoroughly using the three-dimensional crack detection structure formed in the peripheral region surrounding the central region in which the semiconductor integrated circuit is formed. The semiconductor device may prevent or inhibit yield of defective or faulty products through enhanced detection of cracks.

Figure 3:
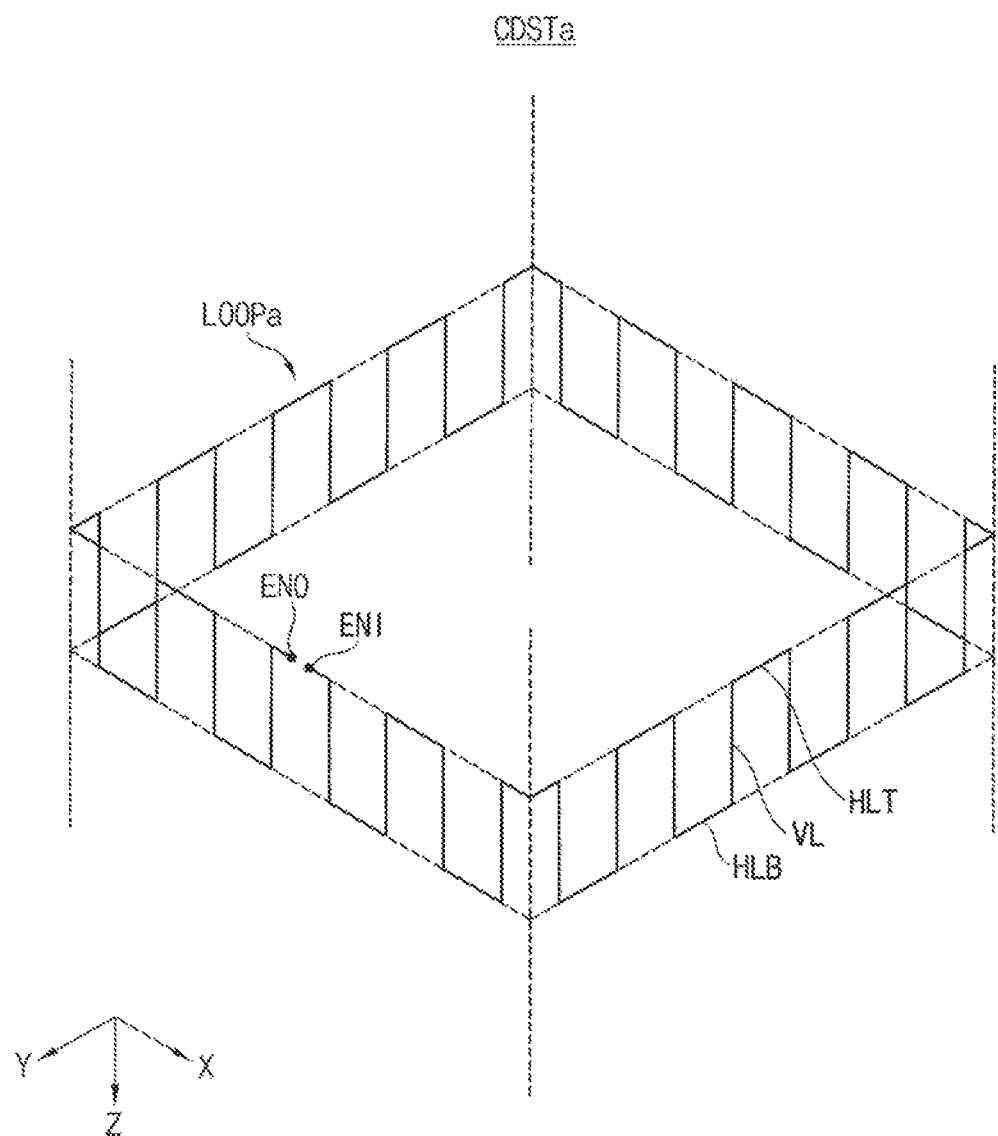
FIG. 3 is a perspective view of a three-dimensional crack detection structure according to example embodiments.

FIG. 3 is a perspective view of a three-dimensional crack detection structure according to example embodiments.

Referring to FIG. 3, a three-dimensional crack detection structure CDSTa may include a single conduction loop LOOPa that provides a continuous electrical connection along conduction loop LOOPa. As will be described below, the semiconductor die SD may include a first conduction layer and a second conduction layer that is provided under the first conduction layer. The first and second conduction layers may be horizontal to a surface of the semiconductor die SD. The conduction layers may include a metal layer in which metal line segments are patterned and/or a polysilicon layer in which polysilicon line segments are patterned. The conduction loop LOOPa may be expanded in the vertical direction between the first conduction layer and the second conduction layer. The conduction loop LOOPa may extend in a vertical direction that is perpendicular to the first and second conduction layers.

The conduction loop LOOPa may include a plurality of top horizontal line segments HLT formed in the first conduction layer, a plurality of bottom horizontal line segments HLB formed in the second conduction layer and a plurality of vertical line segments VL connecting the top horizontal line segments HLT and the bottom horizontal line segments HLB respectively to form the conduction loop LOOPa. The top horizontal line segments HLT and the bottom horizontal line segments HLB may be perpendicular to the vertical line segments VL, which may provide an electrical connection between the top horizontal line segments HLT and the bottom horizontal line segments HLB. The top horizontal line segments HLT, the bottom horizontal line segments HLB and the vertical line segments VL may be disposed alternatively along the conduction loop LOOPa, and may connect an input end node ENI and an output end node ENO in the ring shape to surround the central region of the semiconductor die.

In some example embodiments, the input end node ENI and the output end node ENO may be connected to input-output pads formed on a surface of the semiconductor die so that the conduction loop LOOPa may be connected to an external tester through the input-output pads. In some example embodiments, the input end node ENI and the output end node ENO may be connected to a crack test circuit formed in a portion of the central region of the semiconductor die.

Figure 4:
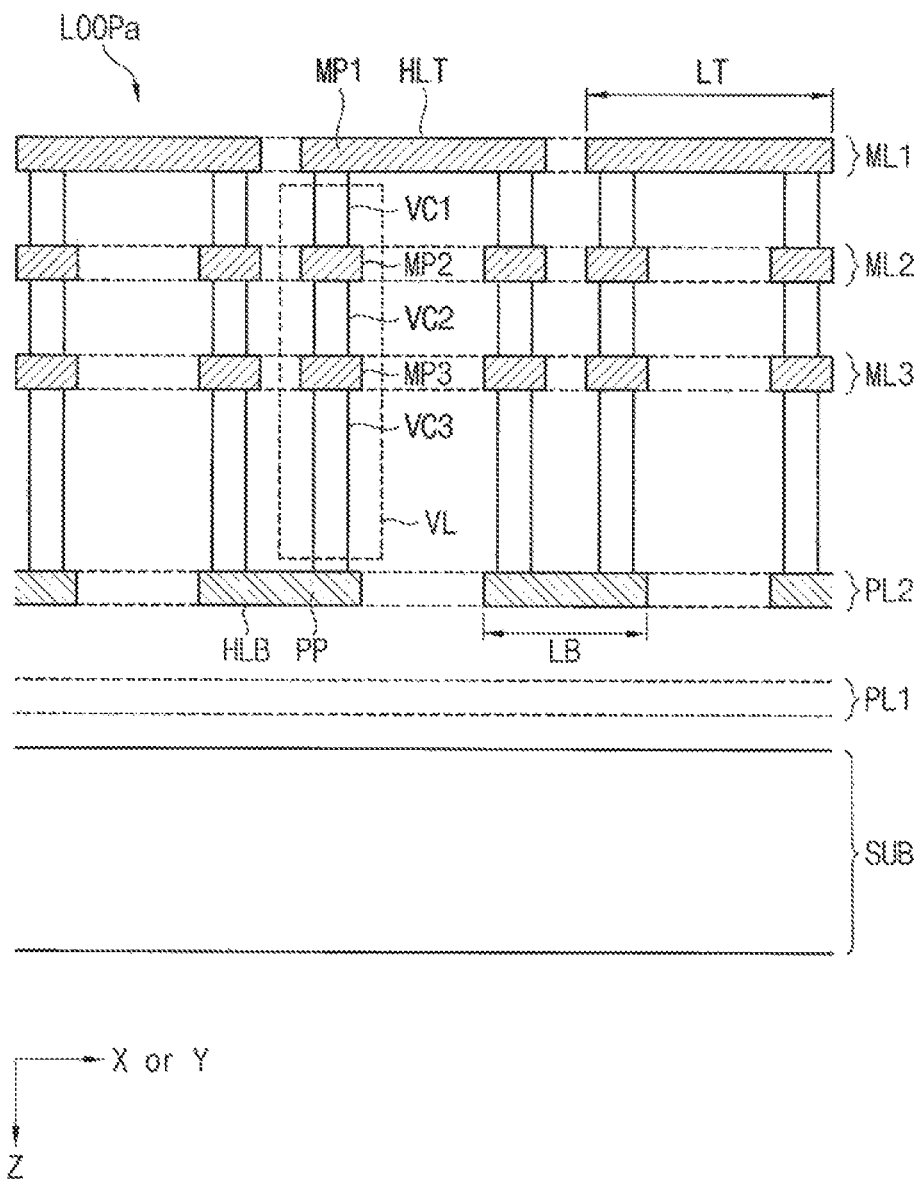
FIGS. 4, 5 and 6 are cross-sectional diagrams illustrating a vertical structure of a three-dimensional crack detection structure according to example embodiments.
Figure 5:
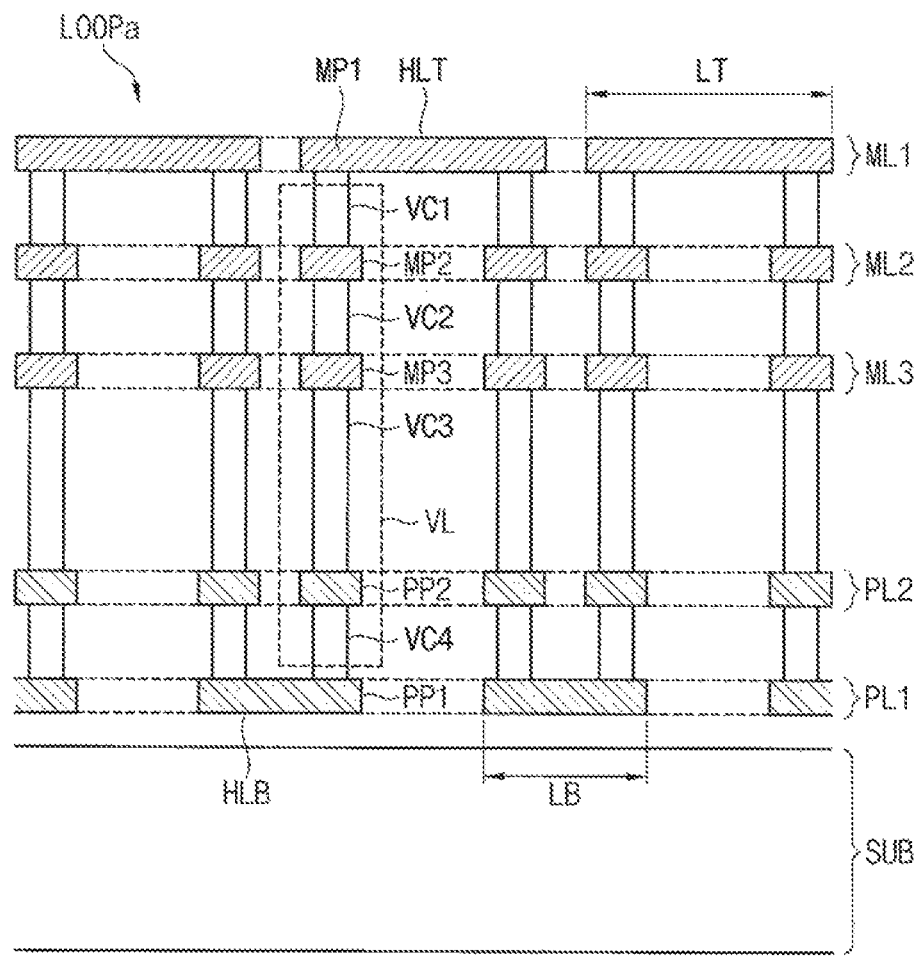
Figure 6:
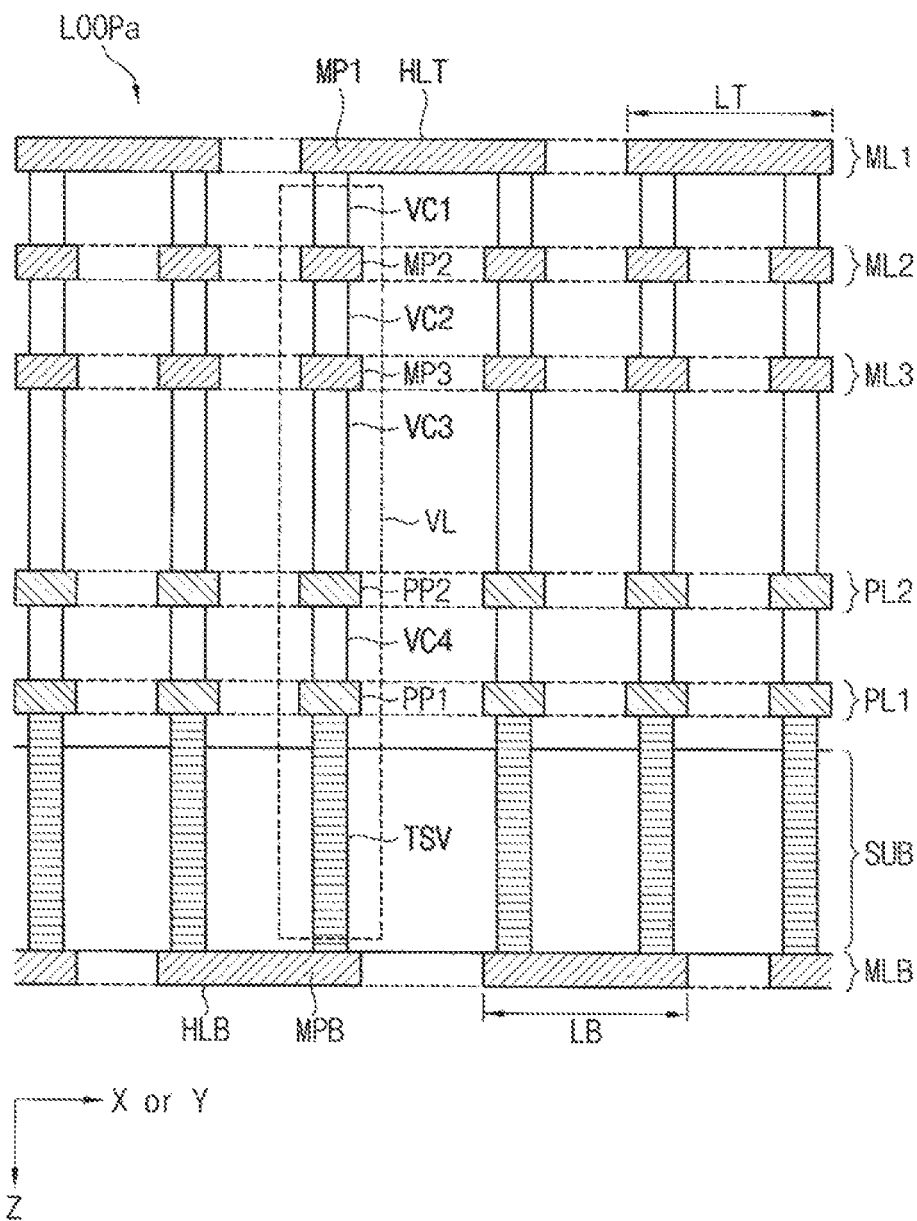

FIGS. 4, 5 and 6 are cross-sectional diagrams illustrating a vertical structure of a three-dimensional crack detection structure according to example embodiments.

Referring to FIG. 4, a semiconductor die may include a semiconductor substrate SUB and a dielectric layer in which upper structures are formed. The dielectric layer may include a plurality of conduction layers ML1, ML2, ML3, PL1 and PL2 in which conduction line patterns are formed. In some embodiments, the conduction layer PL2 may be formed above the conduction layer PL1, the conduction layer ML3 may be formed above the conduction layer PL2, the conduction layer ML2 may be formed above the conduction layer ML3, and the conduction layer ML1 may be formed above the conduction layer ML2. The conduction layers may include one or more metal layers ML1, ML2 and ML3 and one or more polysilicon layers PL1 and PL2. The polysilicon layers may include a polysilicon layer PL1 in which gates of transistors (not shown) in the semiconductor integrated circuit are formed. If the semiconductor integrated circuit is a semiconductor memory device, the polysilicon layers may further include a bitline polysilicon layer PL2 in which bitlines (not shown) in the semiconductor integrated circuit are formed.

The conduction loop LOOPa may include a plurality of top horizontal line segments HLT formed in the first conduction layer ML1, a plurality of bottom horizontal line segments HLB formed in the second conduction layer PL2 and a plurality of vertical line segments VL connecting the top horizontal line segments HLT and the bottom horizontal line segments HLB respectively to form the conduction loop LOOPa. The plurality of vertical line segments VL may extend from the first conduction layer ML1, through intermediate conduction layers ML2 and ML3, to the second conduction layer PL2.

In the embodiment of FIG. 4, the first conduction layer ML1 may correspond to an uppermost metal layer among the metal layer ML1, ML2 and ML3 that are formed over the semiconductor substrate SUB, and the second conduction layer PL2 may correspond to the bitline polysilicon layer that is formed between the semiconductor substrate SUB and the metal layers ML1, ML2 and ML3. The top horizontal line segments HLT may include metal line patterns MP1 formed in the uppermost metal layer ML1, and the bottom horizontal line segments HLB may include polysilicon line patterns PP formed in the bitline polysilicon layer PL2.

The vertical line segments VL may include vertical contacts VC1, VC2 and VC3 to provide an electrical connection between the metal line patterns MP1 in the uppermost metal layer ML1 and the polysilicon line patterns PP in the bitline polysilicon layer PL2. The vertical line segments VL may further include conduction line patterns MP2 and MP3 in the respective intermediate conduction layers ML2 and ML3. In some embodiments, the conduction line pattern in one or both of the intermediate conduction layers ML2 and ML3 may be omitted. For example, the metal line patterns MP2 in the intermediate metal layer ML2 may be omitted, and the two vertical contacts VC1 and VC2 in FIG. 4 may be combined as a longer vertical contact. As another example, the metal line patterns MP3 in the intermediate metal layer ML3 may be omitted, and the two vertical contacts VC2 and VC3 may be combined to form a longer vertical contact. As a further example, the metal line patterns MP2 in the intermediate metal layer ML2 and the metal line patterns MP3 in the intermediate metal layer ML3 may be omitted, and the three vertical contacts VC1, VC2, and VC3 may be combined to form a longer vertical contact.

As can be seen from FIGS. 3 and 4, in some embodiments, along one or more sides of a semiconductor device, a two-dimensional region between an upper-most part of the loop that forms the three-dimensional crack detection circuit and a lower-most part of the loop may have a specific area along the side of the semiconductor device. Further, when considering the entire loop, a three-dimensional region between the upper-most parts of the loop and lower-most parts of the loop through the semiconductor device may have a particular volume. The volume may be, for example, greater than a volume covered through the semiconductor device between a two adjacent sets of metal lines on different vertical levels.

It may be desirable to reduce the entire resistance of the conduction loop LOOPa. The metal line may have a lower electrical resistance than that of the polysilicon line. In some embodiments, in order to reduce the combined resistance of the conduction loop LOOPa, the length LB of the bottom horizontal line segments HLB may be shorter than the length LT of the top horizontal line segments HLT.

Referring to FIG. 5, a semiconductor die may include a semiconductor substrate SUB and a dielectric layer in which upper structures are formed. The dielectric layer may include a plurality of conduction layers ML1, ML2, ML3, PL1 and PL2 in which conduction line patterns are formed. In some embodiments, the conduction layer PL2 may be formed above the conduction layer PL1, the conduction layer ML3 may be formed above the conduction layer PL2, the conduction layer ML2 may be formed above the conduction layer ML3, and the conduction layer ML1 may be formed above the conduction layer ML2. The conduction layers may include one or more metal layers ML1, ML2 and ML3 and one or more polysilicon layers PL1 and PL2. The polysilicon layers may include a polysilicon layer PL1 in which gates of transistors (not shown) in the semiconductor integrated circuit are formed. If the semiconductor integrated circuit is a semiconductor memory device, the polysilicon layers may further include a bitline polysilicon layer PL2 in which bitlines (not shown) in the semiconductor integrated circuit are formed.

The conduction loop LOOPa may include a plurality of top horizontal line segments HLT formed in the first conduction layer ML1, a plurality of bottom horizontal line segments HLB formed in the second conduction layer PL1, and a plurality of vertical line segments VL connecting the top horizontal line segments HLT and the bottom horizontal line segments HLB respectively to form the conduction loop LOOPa. The plurality of vertical line segments VL may extend from the first conduction layer ML1 to the second conduction layer PL1 through intermediate conduction layers ML2, ML3, and PL2.

In the embodiment of FIG. 5, the first conduction layer ML1 may correspond to an uppermost metal layer among the metal layers ML1, ML2 and ML3 that are formed over the semiconductor substrate SUB, and the second conduction layer PL1 may correspond to the gate polysilicon layer that is formed between the semiconductor substrate SUB and the metal layers ML1, ML2 and ML3. The top horizontal line segments HLT may include metal line patterns MP1 formed in the uppermost metal layer ML1, and the bottom horizontal line segments HLB may include polysilicon line patterns PP1 formed in the gate polysilicon layer PL1.

The vertical line segments VL may include vertical contacts VC1, VC2, VC3 and VC4 to provide an electrical connection between the metal line patterns MP1 in the uppermost metal layer ML1 and the polysilicon line patterns PP1 in the gate polysilicon layer PL1. The vertical line segments VL may further include conduction line patterns MP2, MP3 and PP2 in the respective intermediate conduction layers ML2, ML3 and PL2. The conduction line pattern in one or more of the intermediate conduction layers ML2, ML3 and PL2 may be omitted. For example, the polysilicon line patterns PP2 in the bitline polysilicon layer PL2 may be omitted, and the two vertical contacts VC3 and VC4 in FIG. 5 may be combined as a longer vertical contact. As a further example, the metal line patterns MP3 in the intermediate metal layer ML3 may be omitted, and the two vertical contacts VC2 and VC3 may be combined to form a longer vertical contact. As another example, the metal line patterns MP2 in the intermediate metal layer ML2 and the metal line patterns MP3 in the intermediate metal layer ML3 may be omitted, and the three vertical contacts VC1, VC2, and VC3 may be combined to form a longer vertical contact.

It may be desirable to reduce the entire resistance of the conduction loop LOOPa. The metal line may have a lower electrical resistance than that of the polysilicon line. In some embodiments, in order to reduce the entire resistance of the conduction loop LOOPa, the length LB of the bottom horizontal line segments HLB may be shorter than the length LT of the top horizontal line segments HLT.

Referring to FIG. 6, a semiconductor die may include a semiconductor substrate SUB and a dielectric layer in which upper structures are formed. The dielectric layer may include a plurality of conduction layers ML1, ML2, ML3, PL1 and PL2 in which conduction line patterns are formed. In some embodiments, the conduction layer PL2 may be formed above the conduction layer PL1, the conduction layer ML3 may be formed above the conduction layer PL2, the conduction layer ML2 may be formed above the conduction layer ML3, and the conduction layer ML1 may be formed above the conduction layer ML2. The conduction layers may include one or more metal layers ML1, ML2 and ML3 and one or more polysilicon layers PL1 and PL2. The polysilicon layers may include a polysilicon layer PL1 in which gates of transistors (not shown) in the semiconductor integrated circuit are formed. If the semiconductor integrated circuit is a semiconductor memory device, the polysilicon layers may further include a bitline polysilicon layer PL2 in which bitlines (not shown) in the semiconductor integrated circuit are formed.

The conduction loop LOOPa may include a plurality of top horizontal line segments HLT formed in the first conduction layer ML1, a plurality of bottom horizontal line segments HLB formed in the second conduction layer MLB, and a plurality of vertical line segments VL connecting the top horizontal line segments HLT and the bottom horizontal line segments HLB respectively to form the conduction loop LOOPa. The plurality of vertical line segments VL may extend from the first conduction layer ML1 to the second conduction layer MLB through intermediate conduction layers ML2, ML3, PL1, and PL2.

In the embodiment of FIG. 6, the first conduction layer ML1 may correspond to an uppermost metal layer among the metal layers ML1, ML2 and ML3 that are formed over the semiconductor substrate SUB, and the second conduction layer MLB may correspond to a metal layer that is formed on a bottom surface of the semiconductor substrate SUB. The top horizontal line segments HLT may include metal line patterns MP1 formed in the uppermost metal layer ML1, and the bottom horizontal line segments HLB may include metal line patterns MPB formed in the metal layer MLB on the bottom surface of the semiconductor substrate SUB.

The vertical line segments VL may include vertical contacts VC1, VC2, VC3, VC4 and TSV to provide an electrical connection between the metal line patterns MP1 in the uppermost metal layer ML1 and the metal line patterns MPB in the metal layer MLB on the bottom surface of the semiconductor substrate SUB. As illustrated in FIG. 6, the vertical contact TSV may include a through-substrate via TSV penetrating the semiconductor substrate SUB. The vertical line segments VL may further include conduction line patterns MP2, MP3, PP2 and PP1 in the respective intermediate conduction layers ML2, ML3, PL2 and PL1. The conduction line patterns in one or more of the intermediate conduction layers ML2, ML3 and PL2 may be omitted. For example, the polysilicon line patterns PP2 in the bitline polysilicon layer PL2 may be omitted, and the two vertical contacts VC3 and VC4 in FIG. 6 may be combined as a longer vertical contact. As a further example, the metal line patterns MP3 in the intermediate metal layer ML3 may be omitted, and the two vertical contacts VC2 and VC3 may be combined to form a longer vertical contact. As another example, the metal line patterns MP2 in the intermediate metal layer ML2 and the metal line patterns MP3 in the intermediate metal layer ML3 may be omitted, and the three vertical contacts VC1, VC2, and VC3 may be combined to form a longer vertical contact.

In some embodiments, to dispose the vertical line segments VL by a uniform interval, the length LB of the bottom horizontal line segments HLB may be the same as the length LT of the top horizontal line segments HLT. For example, to achieve a uniform spacing in the horizontal direction between the vertical line segments VL, the length LB of the bottom horizontal line segments HLB and the length LT of the top horizontal line segments HLT may be the same.

As described with reference to FIGS. 4, 5 and 6, the three-dimensional crack detection structure CDST according to example embodiments may be expanded in the vertical direction Z to the various depths. For example, the three-dimensional crack detection structure CDST may extend from the metal layer ML1 to the polysilicon layer PL2 as illustrated in FIG. 4, or the three-dimensional crack detection structure CDST may extend from the metal layer ML1 to the polysilicon layer PL1 as illustrated in FIG. 5, or the three-dimensional crack detection structure CDST may extend from the metal layer ML1 through the substrate SUB to the layer MLB as illustrated in FIG. 6. Using the three-dimensional crack detection structure CDST, the crack penetration of various types may be detected more thoroughly.

Figure 7:
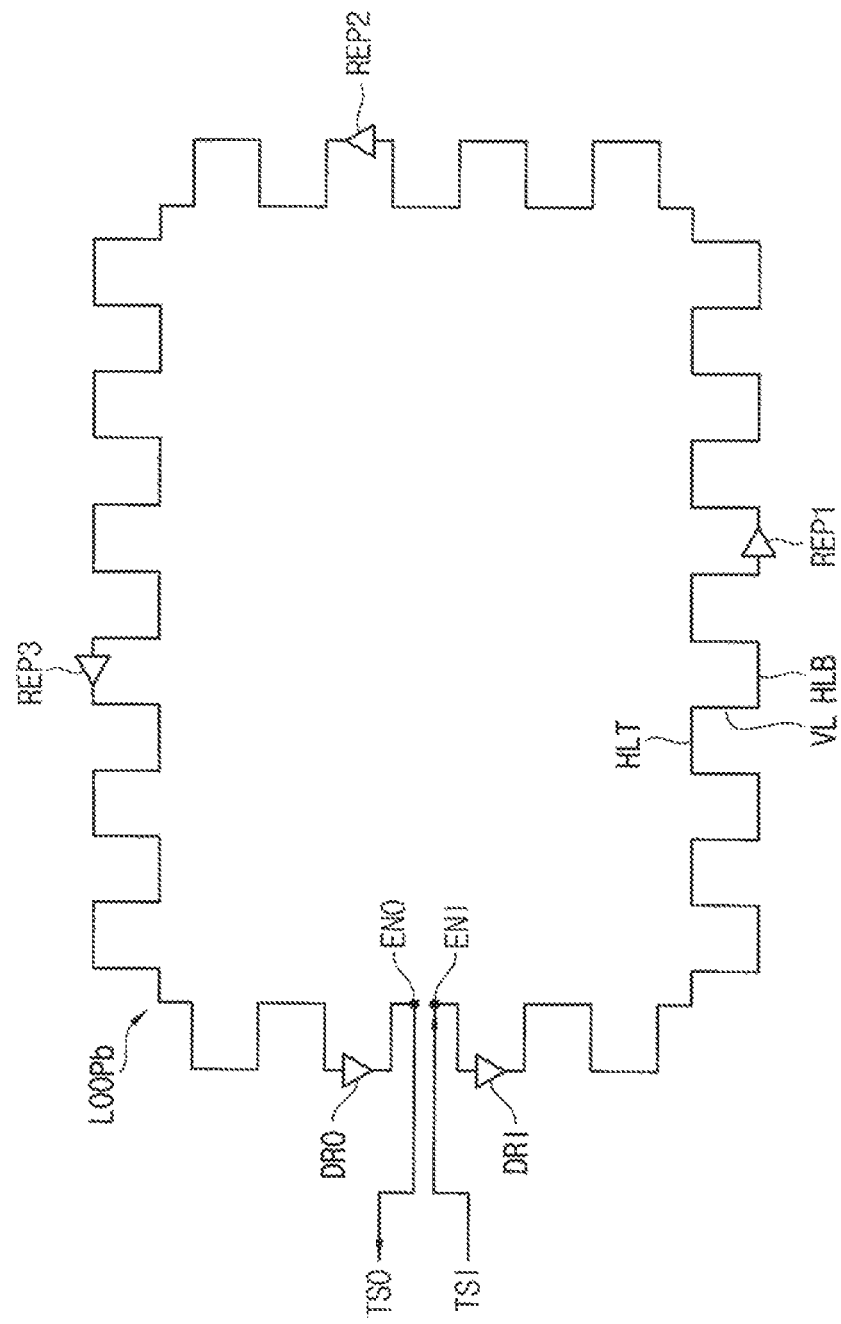
FIG. 7 is a perspective view of a three-dimensional crack detection structure according to example embodiments.

FIG. 7 is a view of a three-dimensional crack detection structure illustrating the electrical connections and depicting the different parts of the vertical line segments VL, the top horizontal line segments HLT, and the bottom horizontal line segments HLB, according to example embodiments.

Referring to FIG. 7, a conduction loop LOOPb may include a plurality of top horizontal line segments HLT formed in the first conduction layer, a plurality of bottom horizontal line segments HLB formed in the second conduction layer, and a plurality of vertical line segments VL connecting the top horizontal line segments HLT and the bottom horizontal line segments HLB respectively to form the conduction loop LOOPb, as described with reference to FIGS. 1 through 6. The top horizontal line segments HLT and the bottom horizontal line segments HLB may be perpendicular to the vertical line segments VL, which may provide an electrical connection between the top horizontal line segments HLT and the bottom horizontal line segments HLB. The top horizontal line segments HLT, the bottom horizontal line segments HLB and the vertical line segments VL may be disposed alternatively along the conduction loop LOOPb, and may connect an input end node ENI and an output end node ENO in the ring shape to surround the central region of the semiconductor die. To detect a crack, a test input signal TSI may be applied to the input end node ENI and a test output signal TSO, which has passed through the three-dimensional crack detection structure or the conduction loop LOOPb, may be provided through the output end node ENO. The occurrence of the crack may be determined by comparing the test input signal TSI and the test output signal TSO. In some embodiments, when the text output signal TSO is different than that of the test input signal TSI or if there is no test output signal TSO, it may be determined that there is a crack.

As illustrated in FIG. 7, the conduction loop LOOPb may include one or more repeaters DR1, REP1, REP2, REP3 and DRO to amplify an input signal and output an amplified signal. If the resistance of the conduction loop LOOPb is high, the test output signal TSO is attenuated significantly and thus the crack detection may be impossible. The test output signal TSO may be strengthened by inserting the repeaters DR1, REP1, REP2, REP3 and DRO. The repeater near the input end node ENI may correspond to an input driver DRI and the repeater near the output end node ENO may correspond to an output driver DRO.

Figure 8:
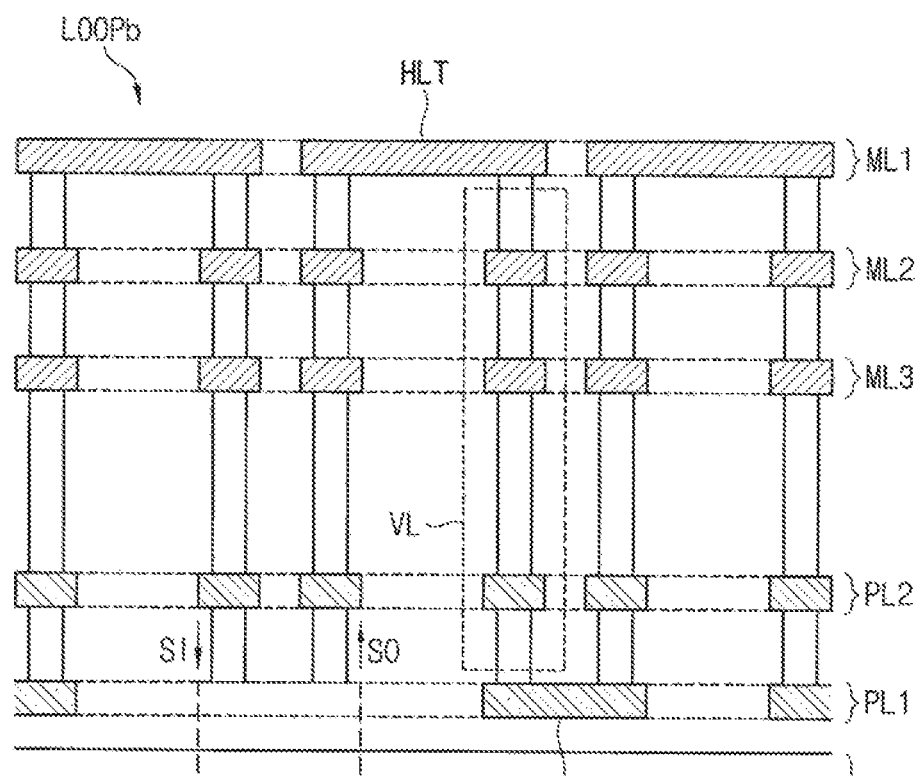
FIG. 8 is a cross-sectional diagram illustrating a vertical structure of a three-dimensional crack detection structure according to example embodiments.

FIG. 8 is a cross-sectional diagram illustrating a vertical structure of a three-dimensional crack detection structure according to example embodiments. The conduction loop LOOPb of FIG. 8 is similar to the conduction loop LOOPa of FIG. 5, and the repeated descriptions are omitted.

Compared with the conduction loop LOOPa of FIG. 5, a portion of the bottom horizontal line segments HLB in the gate polysilicon layer PL1 may be omitted and a repeater REP (e.g., DRO, REP1, REP2, REP3, or DRI) may be formed in the omitted region. The repeater REP may receive an input signal SI from one vertical line segments VL and output an amplified output signal SO to an adjacent vertical line segments VL.

Figure 9:
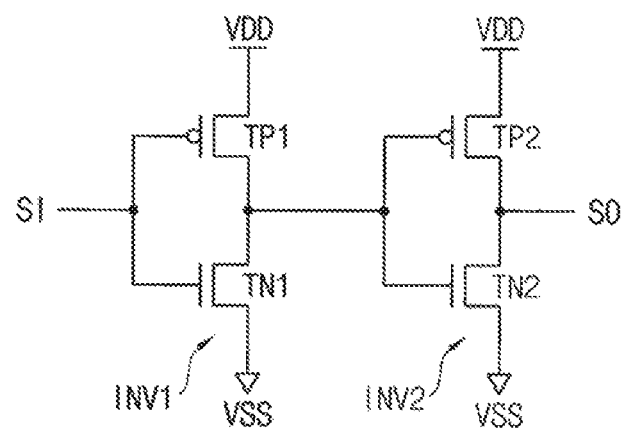
FIG. 9 is a circuit diagram illustrating a repeater included in the three-dimensional crack detection structure of FIG. 8.

FIG. 9 is a circuit diagram illustrating an example repeater included in the three-dimensional crack detection structure of FIG. 8.

FIG. 9 illustrates a repeater REP including two single-stack inverters INV1 and INV2 connected in series between an input node receiving an input signal SI and an output node outputting an output signal SO. In other examples, the repeater may include three or more inverters connected in series between the input node and the output node. As shown in FIG. 9, the single-stack inverters INV1 and INV2 include one p-type transistor TP1 (or TP2) and one n-type transistor TN1 (or TN2) connected between a first voltage VDD and a second voltage VSS. In other examples, the inverters of two or more stacks may be included in the repeater.

The repeater may invert and amplify the input signal SI to output the output signal SO if an odd number of inverters are connected between the input node and the output node. In contrast, the repeater may amplify the input signal SI without inversion to output the output signal SO if an even number of inverters are connected between the input node and the output node. The inverters of the even number of inverters may be referred to as a buffer.

Figure 10:
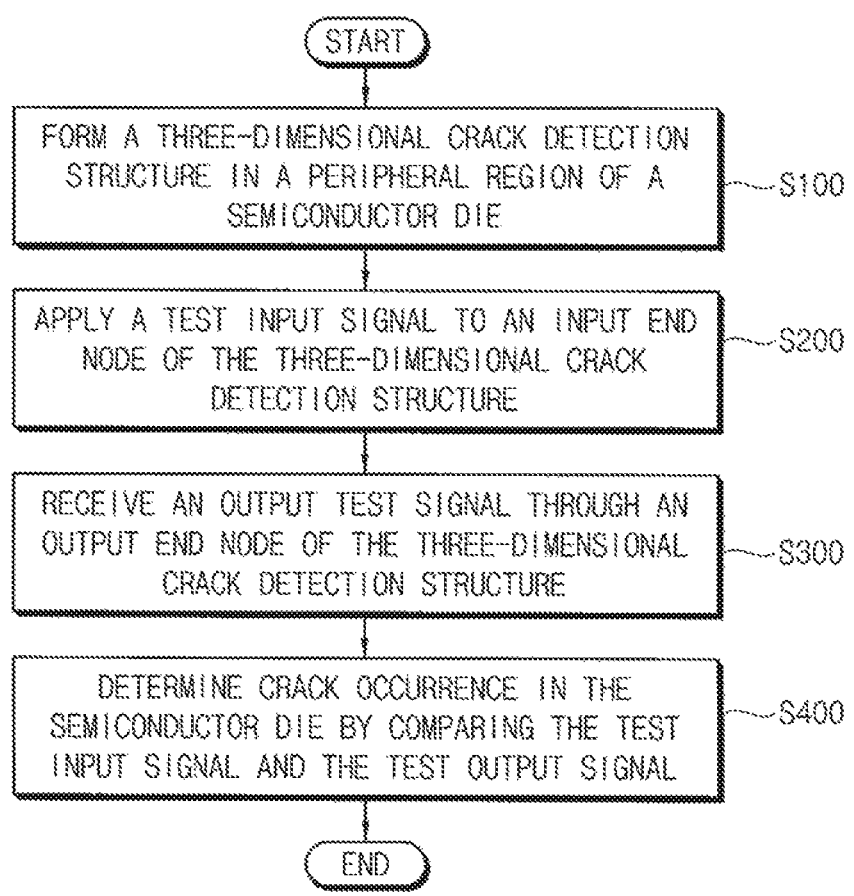
FIG. 10 is a flow chart illustrating a method of detecting a crack in a semiconductor device according to example embodiments.

FIG. 10 is a flow chart illustrating a method of detecting a crack in a semiconductor device according to example embodiments.

As described above with reference to FIG. 1, the semiconductor die SD may include the central region CREG including the semiconductor integrated circuit and the peripheral region PREG surrounding the central region CREG.

Referring to FIG. 10, a three-dimensional crack detection structure CDST may be formed in a peripheral region PREG of a semiconductor die SD (S100). The three-dimensional crack detection structure CDST may be expanded in a vertical direction Z and formed in a ring shape in the peripheral region PREG to surround the central region CREG. As described above, the three-dimensional crack detection structure CDST may include a conduction loop that is expanded in the vertical direction to cover a plurality of conduction layers.

A test input signal TSI may be applied to an input end node of the three-dimensional crack detection structure CDST (S200). An output test signal TSO may be received through an output end node of the three-dimensional crack detection structure CDST (S300). The test output signal TSO is the input test signal TSI after passing through the three-dimensional crack detection structure CDST. For example, the test input signal TSI may be amplified as it is transmitted through the three-dimensional crack detection structure CDST, and the amplified and transmitted test input signal TSI may be the test output signal TSO.

Crack occurrence in the semiconductor die SD may be determined by comparing the test input signal TSI and the test output signal TSO (S400). The comparison of the test input signal TSI and the test output signal TSO may be performed variously. In some example embodiments, voltage levels of the test input signal TSI and the test output signal TSO may be compared to measure a voltage drop through the three-dimensional crack detection structure CDST and then determine the crack occurrence based on the voltage drop. For example, if the voltage drop exceeds a predetermined threshold, it may be determined that a crack has occurred. In other example embodiments, phases of the test input signal TSI and the test output signal TSO may be compared to identify a phase difference or a delay time of the test input signal TSI as it passes through the three-dimensional crack detection structure CDST, and the crack occurrence may be determined based on the phase difference or delay time.

Figure 11:
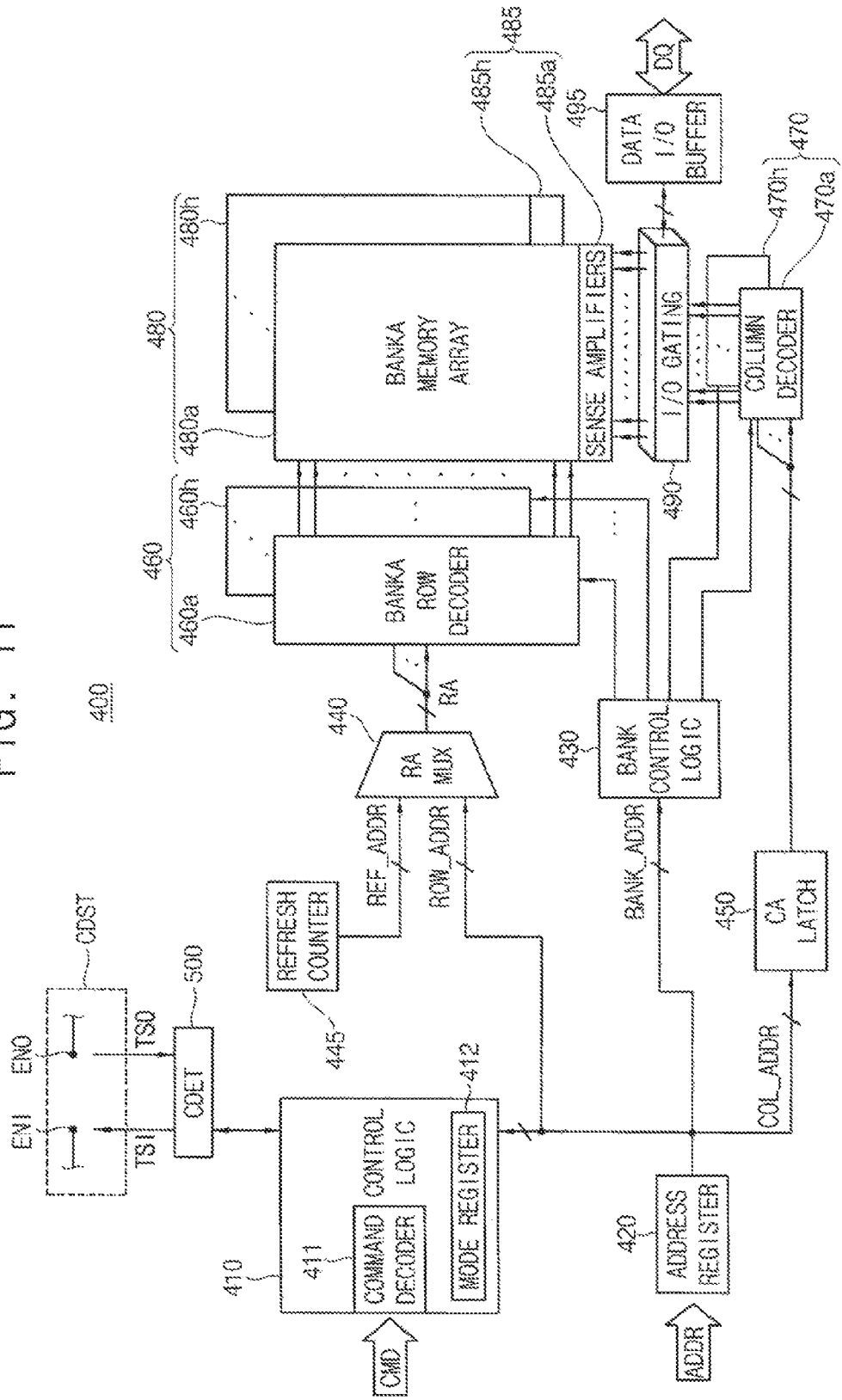
FIG. 11 is a block diagram illustrating a semiconductor memory device according to example embodiments.

FIG. 11 is a block diagram illustrating a semiconductor memory device according to example embodiments.

Referring to FIG. 11, a memory device 400 may include a control logic 410, an address register 420, a bank control logic 430, a row address multiplexer 440, a column address latch 450, a row decoder 460, a column decoder 470, a memory cell array 480, sense amplifiers 485, an input/output (I/O) gating circuit 490, a data input/output (I/O) buffer 495, a refresh counter 445, a crack detector CDET 500 and a three-dimensional crack detection structure CDST. As described above, the three-dimensional crack detection structure CDST may be formed in the peripheral region PREG and the other components in FIG. 11 may be formed in the central region CREG which is surrounded by the peripheral region PREG.

The memory cell array 480 may include a plurality of bank arrays 480a~480h (e.g., BankA Memory Array 480a, etc.). The row decoder 460 may include a plurality of bank row decoders 460a~460h (e.g., BankA Row Decoder 460a, etc.) respectively coupled to the bank arrays 480a~480h, the column decoder 470 may include a plurality of bank column decoders 470a~470h respectively coupled to the bank arrays 480a~480h, and the sense amplifiers 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from the memory controller (not shown). The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. In some embodiments, the bank control logic 430 may generate bank control signals based on the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the first through eighth bank row decoders 460a~460h.

The activated one of the bank row decoders 460a~460h may decode the row address RA that is output from the row address multiplexer 440, and may activate a word-line corresponding to the row address RA. For example, the activated bank row decoder 460 may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input/output gating circuit 490 in order to output data corresponding to the column address COL_ADDR.

The I/O gating circuit 490 may include circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by a sense amplifier 485 coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the first through eighth bank arrays 480a~480h.

The control logic 410 may control operations of the memory device. For example, the control logic 410 may generate control signals for the memory device in order to perform a write operation or a read operation. The control logic 410 may include a command decoder 411 that decodes a command CMD received from the memory controller via the buffer chip 450 and a mode register set 412 that sets an operation mode of the memory device 400.

As discussed above in connection with FIGS. 3 through 8, the three-dimensional crack detection structure CDST may include the conduction loop. The conduction loop may include a plurality of top horizontal line segments HLT formed in the first conduction layer, a plurality of bottom horizontal line segments HLB formed in the second conduction layer and a plurality of vertical line segments VL connecting the top horizontal line segments HLT and the bottom horizontal line segments HLB respectively to form the conduction loop. The top horizontal line segments HLT, the bottom horizontal line segments HLB and the vertical line segments VL may be disposed alternatively along the conduction loop and connect the input end node ENI and the output end node ENO in the ring shape to surround the central region of the semiconductor die.

The crack detector 500 may apply the test input signal TSI to the input end node ENI of the three-dimensional crack detection structure CDST, and receive the test output signal TSO through the output end node ENO of the three-dimensional crack detection structure CDST, where the test output signal TSO corresponds to the test input signal TSI after passing through the three-dimensional crack detection structure CDST. The crack detector 500 may determine the crack occurrence by comparing the test input signal TSI and the test output signal TSO. In some embodiments, the crack detector 500 may detect if a crack has occurred by comparing the test input signal TSI and the test output signal TSO, as described above in connection with FIG. 10.

Figure 12:
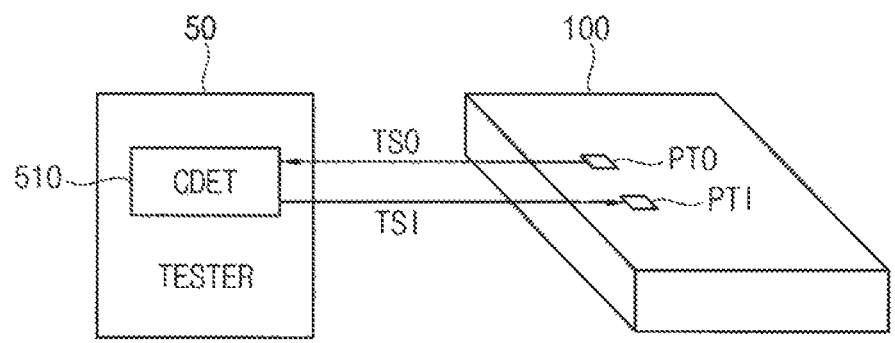
FIG. 12 is a block diagram illustrating a test system according to example embodiments.

FIG. 12 is a block diagram illustrating a test system according to example embodiments.

Referring to FIG. 12, a test system may include a tester 50 and a semiconductor device 100.

The semiconductor device 100 may include a three-dimensional crack detection structure CDST. The three-dimensional crack detection structure CDST may be, for example, a conduction loop, such as described above. The conduction loop may include a plurality of top horizontal line segments HLT formed in the first conduction layer, a plurality of bottom horizontal line segments HLB formed in the second conduction layer and a plurality of vertical line segments VL connecting the top horizontal line segments HLT and the bottom horizontal line segments HLB respectively to form the conduction loop, as discussed above in connection with FIGS. 3-8. The top horizontal line segments HLT, the bottom horizontal line segments HLB and the vertical line segments VL may be disposed alternatively along the conduction loop and connect the input end node ENI and the output end node ENO in the ring shape to surround the central region of the semiconductor die. The input end node ENI and the output end node ENO of the three-dimensional crack detection structure CDST may be connected to a test input pad PTI and a test output pad PTO formed on a surface of the semiconductor die so that the conduction loop may be connected to the tester 50 through the test input and output pads PTI and PTO.

The tester 50 may include a crack detector CDET 510. The crack detector 510 may apply the test input signal TSI to the test input pad PTI, and then receive the test output signal TSO through the test output pad PTO, where the test output signal TSO corresponds to the test input signal TSI after passing through the three-dimensional crack detection structure CDST in the semiconductor device 100. The crack detector 510 may determine the crack occurrence by comparing the test input signal TSI and the test output signal TSO. In some embodiments, the crack detector 500 may detect if a crack has occurred by comparing the test input signal TSI and the test output signal TSO, as described above in connection with FIG. 10.

Figure 13:
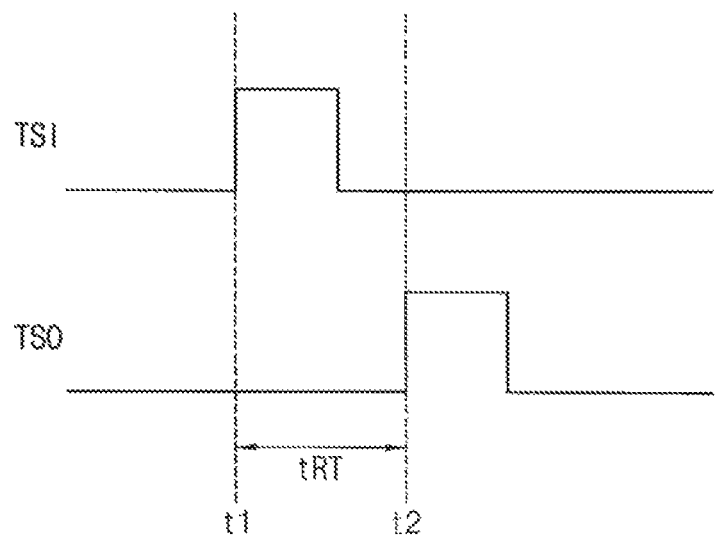
FIG. 13 is a timing diagram illustrating an example of signals for performing the exemplary method of FIG. 10.

FIG. 13 is a timing diagram illustrating an example of signals for performing the method of FIG. 10.

Referring to FIG. 13, the crack detector 500 in FIG. 11 and/or the crack detector 510 in FIG. 12 may compare the phases of the test input signal TSI and the test output signal TSO to measure a delay time tRT or a phase difference between the test input signal TSI and the test output signal TSO. The crack detector 500, 510 may determine the crack occurrence, that is, whether the crack has been occurred, based on the delay time tRT.

The crack detector 500, 510 may generate and apply the test input signal TSI including a pulse at time point t1, and may receive the test output signal including the pulse at time point t2. If the test output signal TSO does not include the pulse, it may be determined that the three-dimensional crack detection structure CDST is cut completely. For example, if the test output signal Tso does not include the pulse, a crack in the semiconductor die may be large enough to completely sever the connection loop of the three-dimensional crack detection structure CDST. If the test output signal TSO includes the pulse, the measured delay time tRT may be compared with a predetermined reference time. If the delay time tRT is longer than the predetermined reference time, it may be determined that the crack has occurred and the semiconductor device may be discarded as a bad or defective product.

Figure 14:
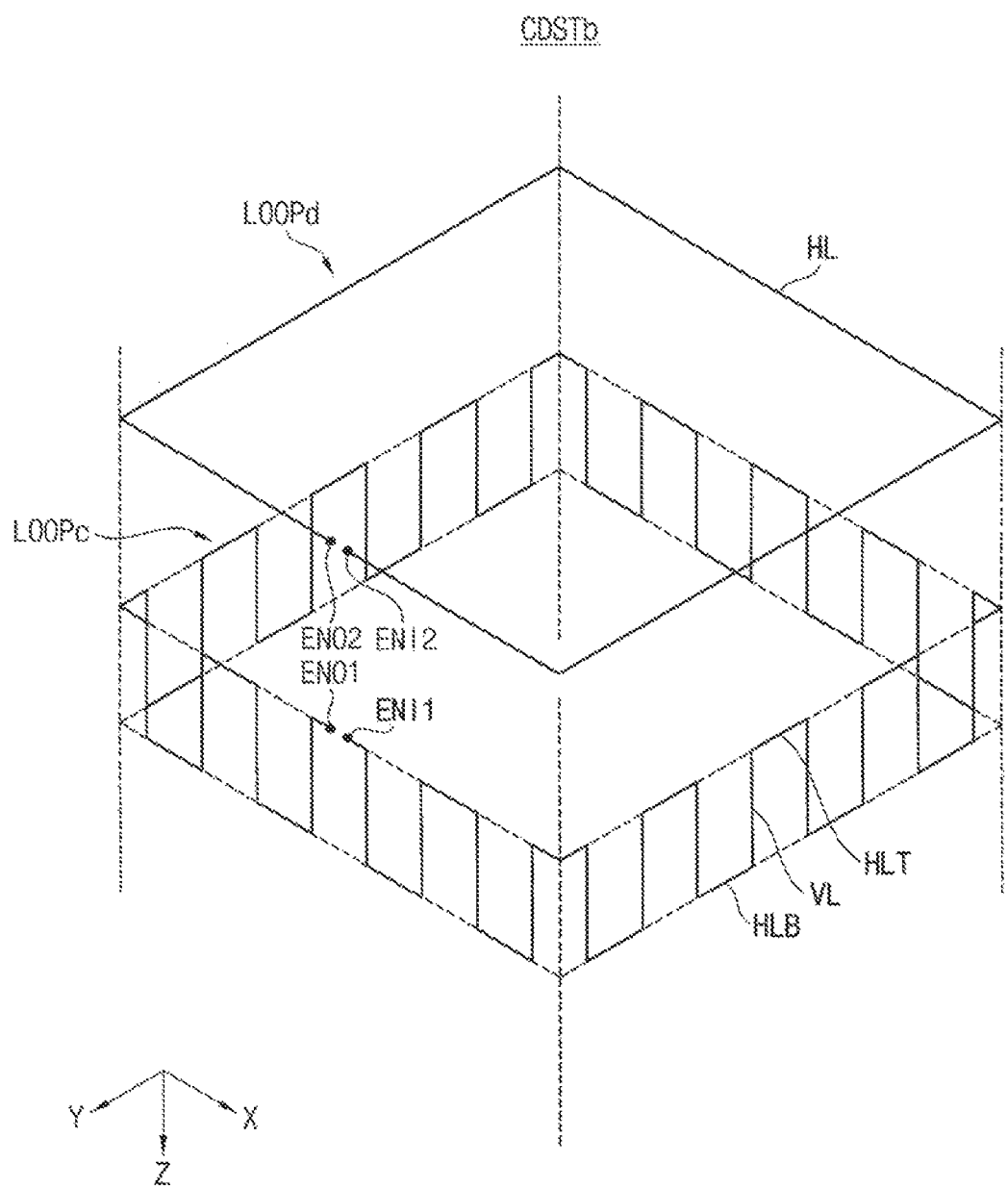
FIG. 14 is a perspective view of a three-dimensional crack detection structure according to example embodiments.

FIG. 14 is a perspective view of a three-dimensional crack detection structure according to example embodiments.

Referring to FIG. 14, a three-dimensional crack detection structure CDSTb may include a first conduction loop LOOPc and a second conduction loop LOOPd. As will be described below, the semiconductor die may include a first conduction layer, a second conduction layer under the first conduction layer, and a third conduction layer under the second conduction layer. The conduction layers may include a metal layer in which metal line segments are patterned and/or a polysilicon layer in which polysilicon line segments are patterned. The first conduction loop LOOPc may be expanded in the vertical direction Z between the second conduction layer and the third conduction layer in a three-dimensional shape. The second conduction loop LOOPd may be formed in the first conduction layer in a two-dimensional shape.

The first conduction loop LOOPc may include a plurality of first top horizontal line segments HLT formed in the second conduction layer, a plurality of bottom horizontal line segments HLB formed in the third conduction layer and a plurality of vertical line segments VL connecting the first top horizontal line segments HLT and the bottom horizontal line segments HLB respectively to form the first conduction loop LOOPc. The top horizontal line segments HLT and the bottom horizontal line segments HLB may be perpendicular to the vertical line segments VL, and the vertical line segments VL may provide an electrical connection between the top horizontal line segments HLT and the bottom horizontal line segments HLB. The second conduction loop LOOPd may include a plurality of second top horizontal line segments HL formed on the first conduction layer. The first top horizontal line segments HLT, the bottom horizontal line segments HLB and the vertical line segments VL may be disposed alternatively along the first conduction loop LOOPc and connect a first input end node ENI1 and a first output end node ENO1 in a ring shape to surround the central region of the semiconductor die. The second top horizontal line segments HL may connect a second input end node ENI2 and a second output end node ENI2 in a ring shape to surround the central region of the semiconductor die.

In some example embodiments, the input end nodes ENI1 and ENI2 and the output end nodes ENO1 and ENO2 may be connected to input-output pads formed on a surface of the semiconductor die so that the conduction loops LOOPc and LOOPd may be connected to an external tester through the input-output pads. In some example embodiments, the input end nodes ENI1 and ENI2 and the output end nodes ENO1 and ENO2 may be connected to a crack test circuit such as a crack detector formed in a portion of the central region of the semiconductor die.

Figure 15:
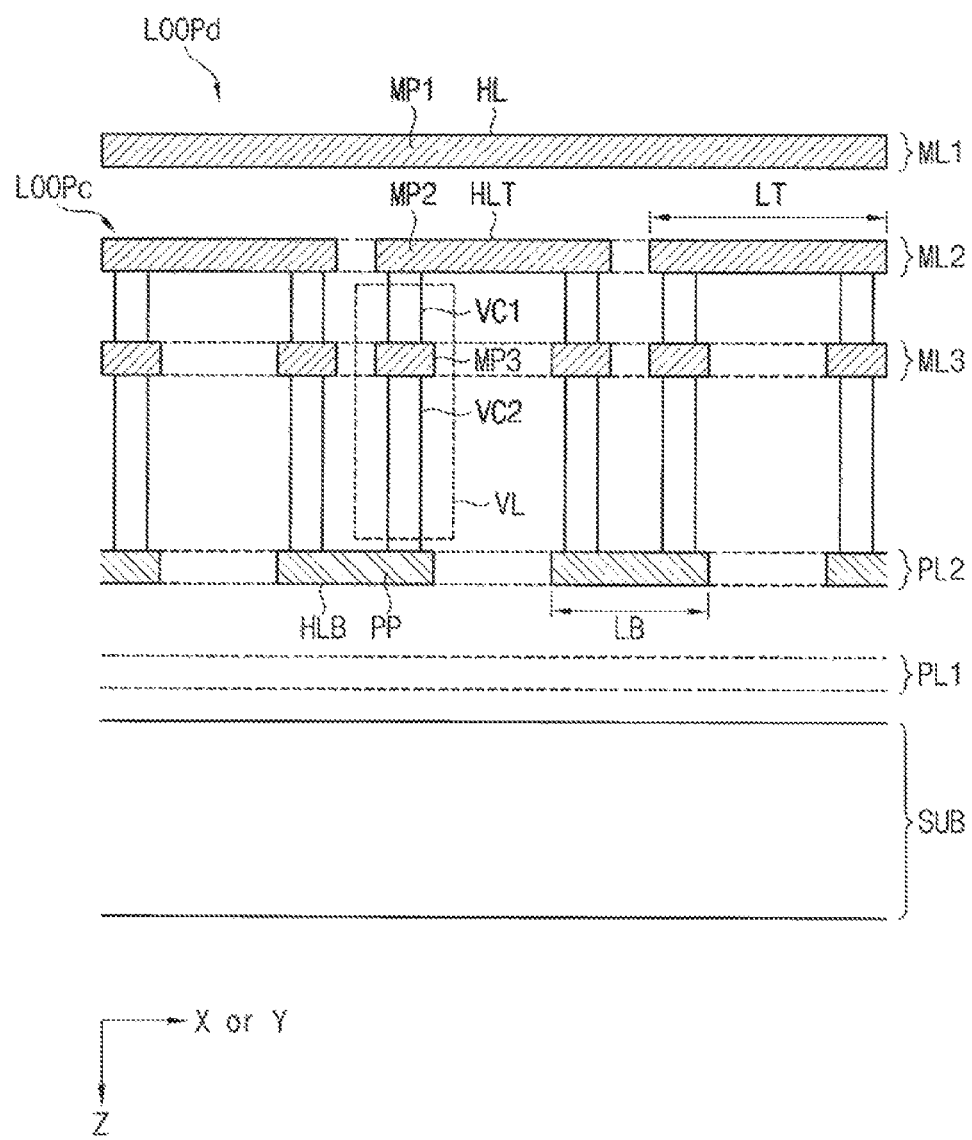
FIGS. 15, 16 and 17 are cross-sectional diagrams illustrating a vertical structure of a three-dimensional crack detection structure according to example embodiments.
Figure 16:
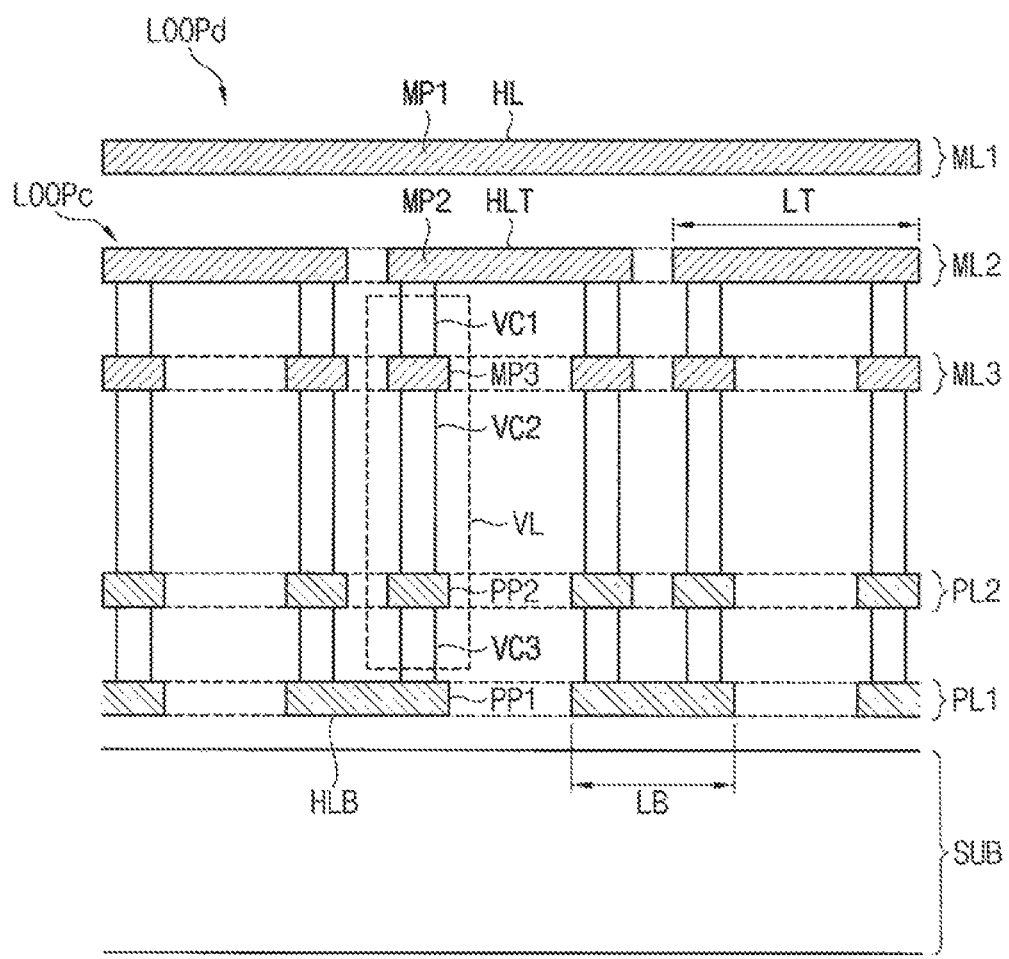
Figure 17:
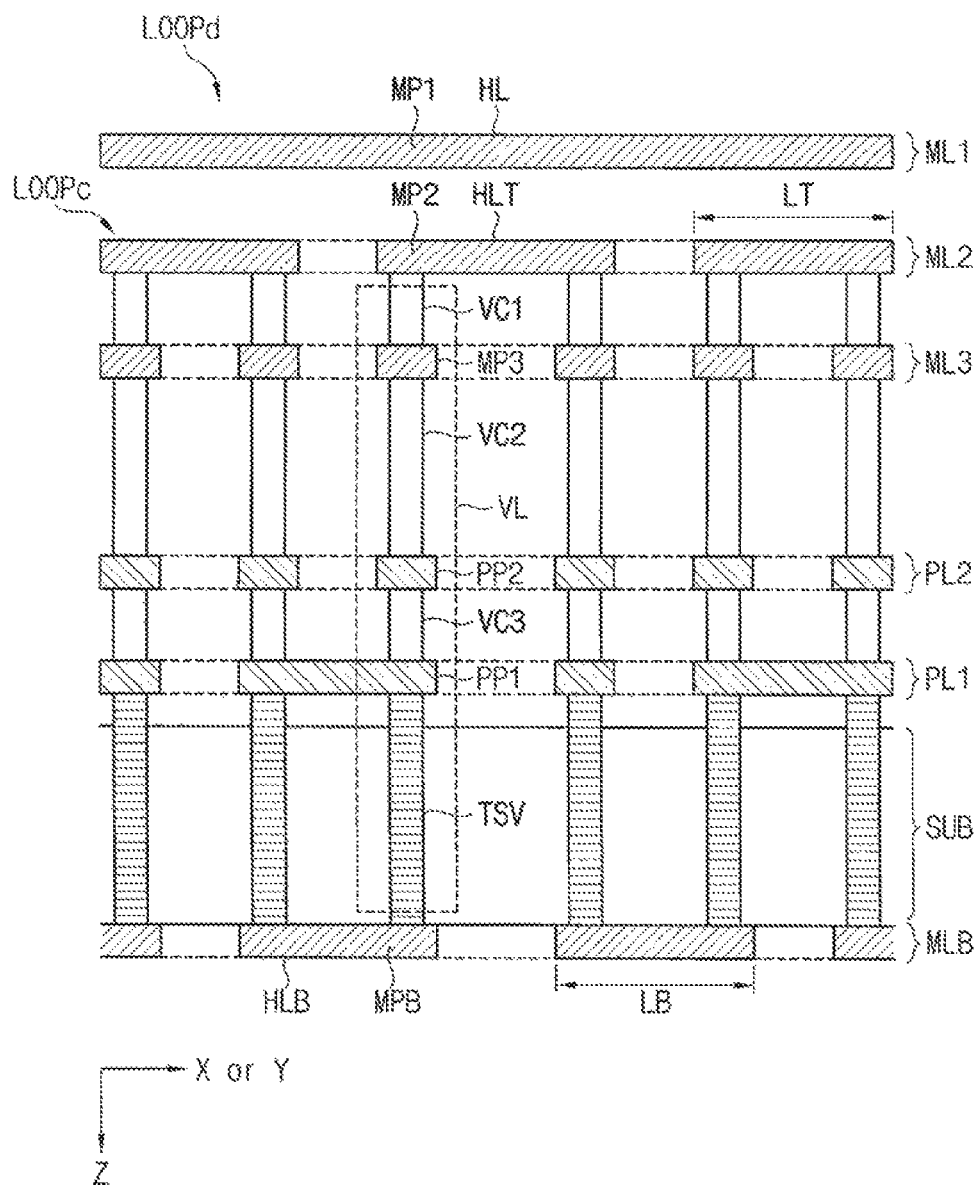

FIGS. 15, 16 and 17 are cross-sectional diagrams illustrating a vertical structure of a three-dimensional crack detection structure according to example embodiments.

Referring to FIG. 15, a semiconductor die may include a semiconductor substrate SUB and a dielectric layer in which upper structures are formed. The dielectric layer may include a plurality of conduction layers ML1, ML2, ML3, PL1 and PL2 in which conduction line patterns are formed. In some embodiments, the conduction layer PL2 may be formed above the conduction layer PL1, the conduction layer ML3 may be formed above the conduction layer PL2, the conduction layer ML2 may be formed above the conduction layer ML3, and the conduction layer ML1 may be formed above the conduction layer ML2. The conduction layers may include one or more metal layers ML1, ML2 and ML3 and one or more polysilicon layers PL1 and PL2. The polysilicon layers may include a polysilicon layer PL1 in which gates of transistors (not shown) in the semiconductor integrated circuit are formed. If the semiconductor integrated circuit is a semiconductor memory device, the polysilicon layers may further include a bitline polysilicon layer PL2 in which bitlines (not shown) in the semiconductor integrated circuit are formed.

The first conduction loop LOOPc may include a plurality of first top horizontal line segments HLT formed in the second conduction layer ML2, a plurality of bottom horizontal line segments HLB formed in the second conduction layer PL2 and a plurality of vertical line segments VL connecting the first top horizontal line segments HLT and the bottom horizontal line segments HLB respectively to form the first conduction loop LOOPc. The plurality of vertical line segments VL may extend from the second conduction layer ML2 to the second conduction layer PL2 through intermediate conduction layer ML3. The second conduction loop LOOPd may include a plurality of second top horizontal line segments HL formed in the first conduction layer ML1 over the second conduction layer ML2.

In the embodiment of FIG. 15, the first conduction layer ML1 may correspond to an uppermost metal layer among the metal layer ML1, ML2 and ML3 that are formed over the semiconductor substrate SUB, the second conduction layer ML2 may be a metal layer under the uppermost metal layer ML1, and the third conduction layer PL2 may correspond to the bitline polysilicon layer that is formed between the semiconductor substrate SUB and the metal layers ML1, ML2 and ML3. The first top horizontal line segments HLT may include metal line patterns MP2 formed in the second metal layer ML2, and the bottom horizontal line segments HLB may include polysilicon line patterns PP formed in the bitline polysilicon layer PL2. The second top horizontal line segments HL may include metal line patterns MP1 formed in the first metal layer ML1.

The vertical line segments VL may include vertical contacts VC1 and VC2 to provide an electrical connection between the metal line patterns MP2 in the second metal layer ML2 and the polysilicon line patterns PP in the bitline polysilicon layer PL2. The vertical line segments VL may further include conduction line patterns MP3 in the intermediate conduction layer ML3. The metal line patterns MP3 in the third metal layer ML3 may be omitted, and the two vertical contacts VC1 and VC2 in FIG. 15 may be combined as a longer vertical contact.

It may be desirable to reduce the entire resistance of the first conduction loop LOOPc. The metal line may have a lower electrical resistance than that of the polysilicon line. In some embodiments, in order to reduce the entire resistance of the first conduction loop LOOPc, the length LB of the bottom horizontal line segments HLB (i.e., the polysilicon line having the higher resistance) may be shorter than the length LT of the top horizontal line segments HLT (i.e., the metal lines having the lower resistance).

Referring to FIG. 16, a semiconductor die may include a semiconductor substrate SUB and a dielectric layer in which upper structures are formed. The dielectric layer may include a plurality of conduction layers ML1, ML2, ML3, PL1 and PL2 in which conduction line patterns are formed. In some embodiments, the conduction layer PL2 may be formed above the conduction layer PL1, the conduction layer ML3 may be formed above the conduction layer PL2, the conduction layer ML2 may be formed above the conduction layer ML3, and the conduction layer ML1 may be formed above the conduction layer ML2. The conduction layers may include one or more metal layers ML1, ML2 and ML3 and one or more polysilicon layers PL1 and PL2. The polysilicon layers may include a polysilicon layer PL1 in which gates of transistors (not shown) in the semiconductor integrated circuit are formed. If the semiconductor integrated circuit is a semiconductor memory device, the polysilicon layers may further include a bitline polysilicon layer PL2 in which bitlines (not shown) in the semiconductor integrated circuit are formed.

The first conduction loop LOOPc may include a plurality of first top horizontal line segments HLT formed in the second conduction layer ML2, a plurality of bottom horizontal line segments HLB formed in the second conduction layer PL1 and a plurality of vertical line segments VL connecting the first top horizontal line segments HLT and the bottom horizontal line segments HLB respectively to form the first conduction loop LOOPc. The plurality of vertical line segments VL may extend from the second conduction layer ML2, through intermediate conduction layers ML3 and PL2, to the second conduction layer PL1. The second conduction loop LOOPd may include a plurality of second top horizontal line segments HL formed in the first conduction layer ML1 over the second conduction layer ML2.

In the embodiment of FIG. 16, the first conduction layer ML1 may correspond to an uppermost metal layer among the metal layer ML1, ML2 and ML3 that are formed over the semiconductor substrate SUB, the second conduction layer ML2 may be a metal layer under the uppermost metal layer ML1, and the third conduction layer PL1 may correspond to the gate polysilicon layer that is formed between the semiconductor substrate SUB and the metal layers ML1, ML2 and ML3. The first top horizontal line segments HLT may include metal line patterns MP2 formed in the metal layer ML2, and the bottom horizontal line segments HLB may include polysilicon line patterns PP1 formed in the gate polysilicon layer PL1. The second top horizontal line segments HL may include metal line patterns MP1 formed in the first metal layer ML1.

The vertical line segments VL may include vertical contacts VC1, VC2 and VC3 to provide an electrical connection between the metal line patterns MP2 in the metal layer ML2 and the polysilicon line patterns PP1 in the gate polysilicon layer PL1. The vertical line segments VL may further include conduction line patterns MP3 and PP2 in the intermediate conduction layers ML3 and PL2. The conduction line pattern in at least one of the intermediate conduction layer ML3 and PL2 may be omitted. For example, the polysilicon line patterns PP2 in the bitline polysilicon layer PL2 may be omitted, and the two vertical contacts VC2 and VC3 in FIG. 16 may be combined as a longer vertical contact.

It may be desirable to reduce the entire resistance of the first conduction loop LOOPc. The metal line may have a lower resistance than that of the polysilicon line. In some embodiments, in order to reduce the entire resistance of the first conduction loop LOOPc, the length LB of the bottom horizontal line segments HLB may be shorter than the length LT of the top horizontal line segments HLT.

Referring to FIG. 17, a semiconductor die may include a semiconductor substrate SUB and a dielectric layer in which upper structures are formed. The dielectric layer may include a plurality of conduction layers ML1, ML2, ML3, PL1 and PL2 in which conduction line patterns are formed. In some embodiments, the conduction layer PL2 may be formed above the conduction layer PL1, the conduction layer ML3 may be formed above the conduction layer PL2, the conduction layer ML2 may be formed above the conduction layer ML3, and the conduction layer ML1 may be formed above the conduction layer ML2. The conduction layers may include one or more metal layers ML1, ML2 and ML3 and one or more polysilicon layers PL1 and PL2. The polysilicon layers may include a polysilicon layer PL1 in which gates of transistors (not shown) in the semiconductor integrated circuit are formed. If the semiconductor integrated circuit is a semiconductor memory device, the polysilicon layers may further include a bitline polysilicon layer PL2 in which bitlines (not shown) in the semiconductor integrated circuit are formed.

The first conduction loop LOOPc may include a plurality of first top horizontal line segments HLT formed in the second conduction layer ML2, a plurality of bottom horizontal line segments HLB formed in the second conduction layer MLB and a plurality of vertical line segments VL connecting the first top horizontal line segments HLT and the bottom horizontal line segments HLB respectively to form the first conduction loop LOOPc. The plurality of vertical line segments VL may extend from the second conduction layer ML2 to the second conduction layer MLB through intermediate conduction layers ML3, PL2, and PL1. The second conduction loop LOOPd may include a plurality of second top horizontal line segments HL formed in the first conduction layer ML1 over the second conduction layer ML2.

In the embodiment of FIG. 17, the first conduction layer ML1 may correspond to an uppermost metal layer among the metal layer ML1, ML2 and ML3 that are formed over the semiconductor substrate SUB, the second conduction layer ML2 may correspond to a metal later under the uppermost metal layer ML1, and the third conduction layer MLB may correspond to a metal layer that is formed on a bottom surface of the semiconductor substrate SUB. The first top horizontal line segments HLT may include metal line patterns MP2 formed in the metal layer ML2, and the bottom horizontal line segments HLB may include metal line patterns MPB formed in the metal layer MLB on the bottom surface of the semiconductor substrate SUB. The second top horizontal line segments HL may include metal line patterns MP1 formed in the first metal layer ML1.

The vertical line segments VL may include vertical contacts VC1, VC2, VC3 and TSV to provide an electrical connection between the metal line patterns MP2 in the metal layer ML2 and the metal line patterns MPB in the metal layer MLB on the bottom surface of the semiconductor substrate SUB. As illustrated in FIG. 17, the vertical contacts TSV may include the through-substrate via TSV penetrating the semiconductor substrate SUB. The vertical line segments VL may further include conduction line patterns MP3, PP2 and PP1 in the intermediate conduction layers ML3, PL2 and PL1. The conduction line patterns in one or more of the intermediate conduction layer ML3 and PL2 may be omitted. For example, the polysilicon line patterns PP2 in the bitline polysilicon layer PL2 may be omitted, and the two vertical contacts VC2 and VC3 in FIG. 17 may be combined as a longer vertical contact. As a further example, the metal line patterns MP3 in the intermediate metal layer ML3 may be omitted, and the two vertical contacts VC1 and VC2 may be combined to form a longer vertical contact.

In some embodiment, to dispose the vertical line segments VL by a uniform interval, the length LB of the bottom horizontal line segments HLB may be the same as the length LT of the first top horizontal line segments HLT. For example, to achieve a uniform spacing in the horizontal direction between the vertical line segments VL, the length LB of the bottom horizontal line segments HLB and the length LT of the top horizontal line segments HLT may be the same.

As described with reference to FIGS. 15, 16 and 17, the three-dimensional crack detection structure CDST according to example embodiments may be expanded in the vertical direction Z to the various depths. For example, the three-dimensional crack detection structure CDST may extend from the metal layer ML2 to the polysilicon layer PL2 as illustrated in FIG. 15, or the three-dimensional crack detection structure CDST may extend from the metal layer ML2 to the polysilicon layer PL1 as illustrated in FIG. 16, or the three-dimensional crack detection structure CDST may extend from the metal layer ML2 through the substrate SUB to the layer MLB as illustrated in FIG. 17. Using the three-dimensional crack detection structure CDST, the crack penetration of various types may be detected more thoroughly.

Figure 18:
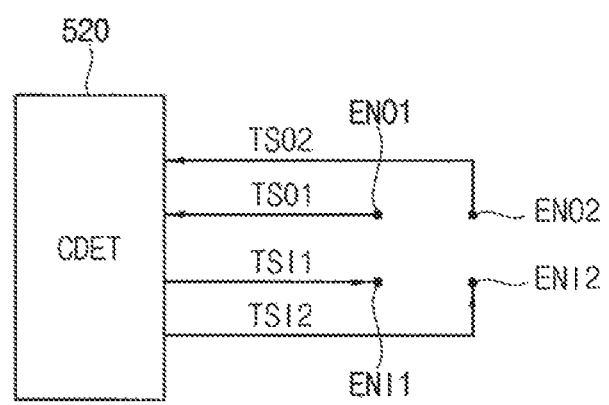
FIG. 18 is a diagram for describing a method of detecting a crack in a semiconductor device according to example embodiments.

FIG. 18 is a diagram for describing a method of detecting a crack in a semiconductor device according to example embodiments.

The semiconductor device may include a three-dimensional crack detection structure CDST, e.g., the first conduction loop LOOPc and the second conduction loop LOOPd, as described above. The first conduction loop LOOPc may include a plurality of first top horizontal line segments HLT formed in the second conduction layer, a plurality of bottom horizontal line segments HLB formed in the second conduction layer and a plurality of vertical line segments VL connecting the first top horizontal line segments HLT and the bottom horizontal line segments HLB respectively to form the first conduction loop LOOPc. The top horizontal line segments HLT and the bottom horizontal line segments HLB may be perpendicular to the vertical line segments VL, and the vertical line segments VL may provide an electrical connection between the top horizontal line segments HLT and the bottom horizontal line segments HLB. The second conduction loop LOOPd may include a plurality of second top horizontal line segments HL formed in the first conduction layer. The first top horizontal line segments HLT, the bottom horizontal line segments HLB and the vertical line segments VL may be disposed alternatively along the conduction loop and connect the first input end node ENI1 and the first output end node ENO1 in the ring shape to surround the central region of the semiconductor die. The second top horizontal line segments HL may connect the second input end node ENI2 and the second output end node ENO2 in the ring shape to surround the central region of the semiconductor die.

As described with reference to FIGS. 11 and 12, the crack detector CDET 520 may be included in an external tester or in an internal circuit of the semiconductor device. The crack detector CDET 520 may apply the first test input signal TSI1 to the first input end node ENI1 and then receive the first test output signal TSO through the first output end node ENI1. Also, the crack detector CDET 520 may apply the second test input signal TSI2 to the second input end node ENI2 and then receive the second test output signal TSO2 through the second output end node ENI2.

The first test output signal TSO1 corresponds to the first test input signal TSI1 after passing through the first conduction loop LOOPc, and the second test output signal TSO2 corresponds to the second test input signal TSI2 after passing through the second conduction loop LOOPd. The crack detector CDET 520 may determine the crack occurrence by comparing the first test input signal TSI1 and the first test output signal TSO1 and by comparing the second test input signal TSI2 and the second test output signal TSO2.

Figure 19:
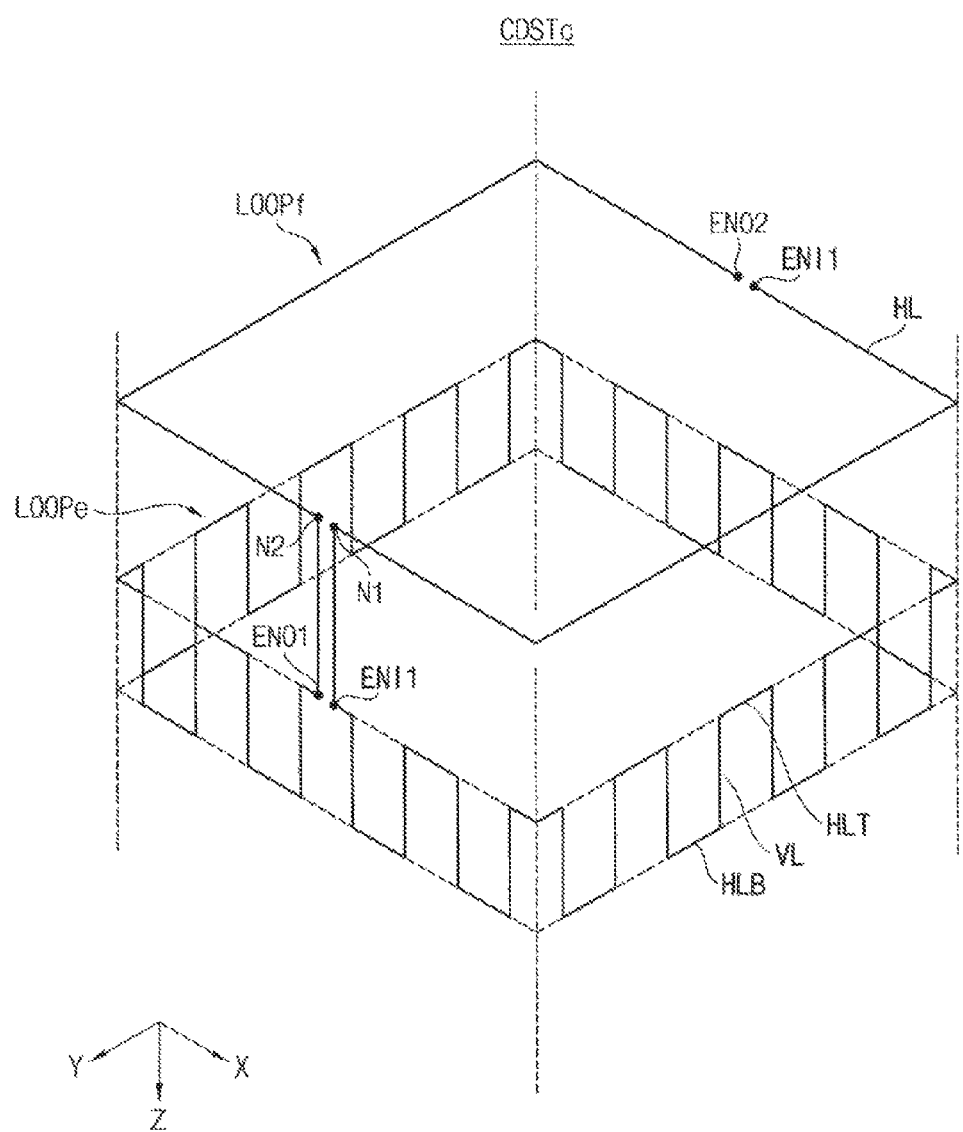
FIG. 19 is a perspective view of a three-dimensional crack detection structure according to example embodiments.

FIG. 19 is a perspective view of a three-dimensional crack detection structure according to example embodiments.

Referring to FIG. 19, a three-dimensional crack detection structure CDSTc may include a first conduction loop LOOPe and a second conduction loop LOOPf. As described above, the semiconductor die may include a first conduction layer, a second conduction layer under the first conduction layer and a third conduction layer under the second conduction layer. The conduction layers may include a metal layer in which metal line segments are patterned and/or a polysilicon layer in which polysilicon line segments are patterned. The first conduction loop LOOPe may be expanded in the vertical direction Z between the second conduction layer and the third conduction layer in a three-dimensional shape. The second conduction loop LOOPf may be formed in the first conduction layer in a two-dimensional shape.

The first conduction loop LOOPe may include a plurality of first top horizontal line segments HLT formed in the second conduction layer, a plurality of bottom horizontal line segments HLB formed in the third conduction layer and a plurality of vertical line segments VL connecting the first top horizontal line segments HLT and the bottom horizontal line segments HLB respectively to form the first conduction loop LOOPe. The top horizontal line segments HLT and the bottom horizontal line segments HLB may be perpendicular to the vertical line segments VL, and the vertical line segments VL may provide an electrical connection between the top horizontal line segments HLT and the bottom horizontal line segments HLB. The second conduction loop LOOPf may include a plurality of second top horizontal line segments HL formed on the first conduction layer. The first top horizontal line segments HLT, the bottom horizontal line segments HLB and the vertical line segments VL may be disposed alternatively along the first conduction loop LOOPe and connect a first input end node ENI1 and a first output end node ENO1 in a ring shape to surround the central region of the semiconductor die. The second top horizontal line segments HL may connect a second input end node ENI2 and a second output end node ENI2 in a ring shape to surround the central region of the semiconductor die. As illustrated in FIG. 19, the end nodes ENI1 and ENO2 of the first conduction loop LOOPe may be connected to intermediate nodes of the second conduction loop LOOPf such that the first and second conduction loops LOOPe and LOOPf may form a combined conduction loop.

In some example embodiments, the second input end node ENI2 and the second output end node ENO2 may be connected to input-output pads formed on a surface of the semiconductor die so that the combined conduction loop may be connected to an external tester through the input-output pads. In some example embodiments, the second input end node ENI2 and the second output end node ENO2 may be connected to a crack test circuit such as a crack detector formed in a portion of the central region of the semiconductor die.

Figure 20:
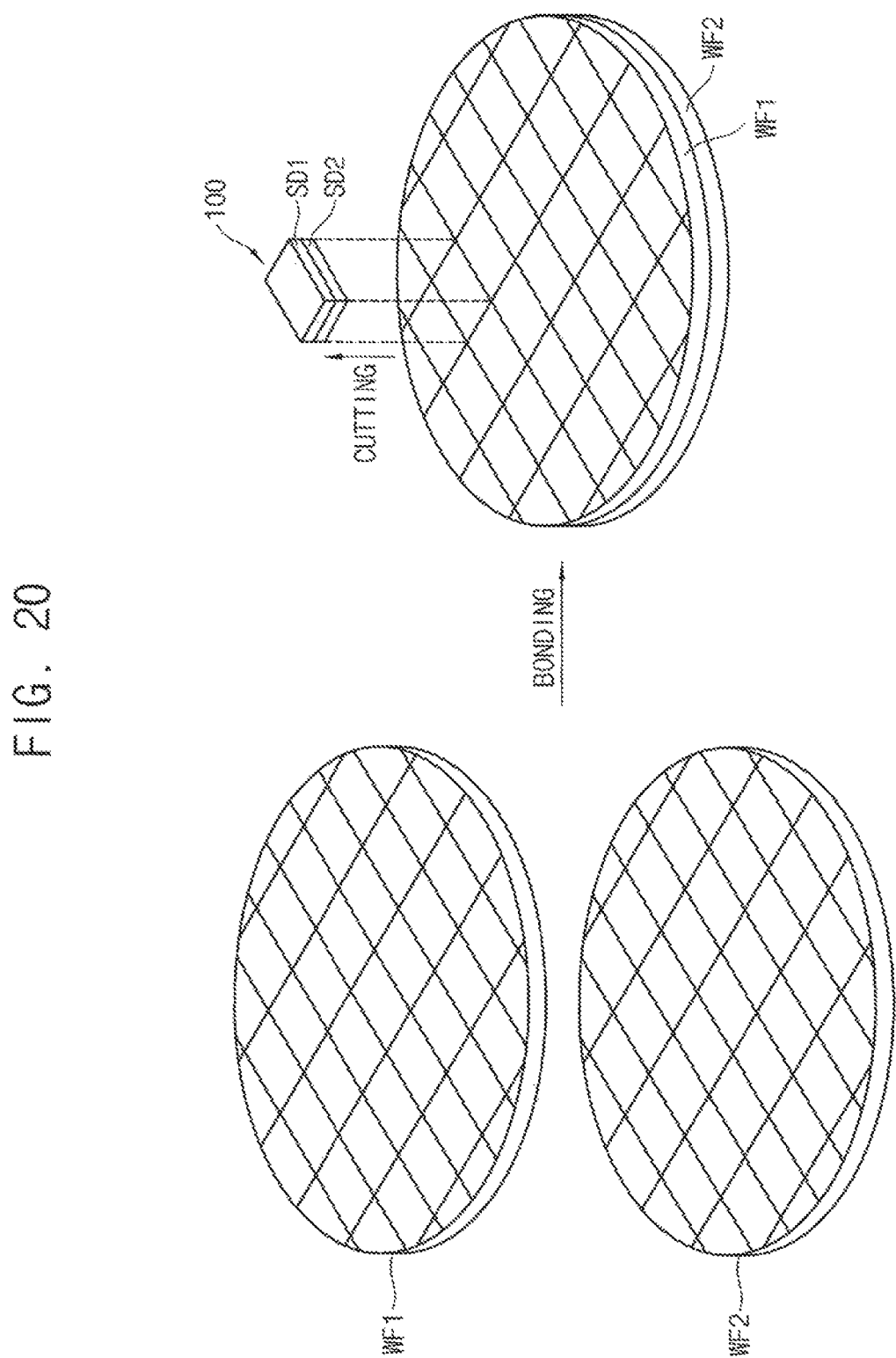
FIG. 20 is a diagram for describing manufacturing processes of a stacked semiconductor device according to example embodiments.

FIG. 20 is a diagram for describing manufacturing processes of a stacked semiconductor device according to example embodiments.

Referring to FIG. 20, respective integrated circuits may be formed in a first wafer WF1 and a second wafer WF2. The same circuits may be integrated in the first wafer WF1 and the second wafer WF2 or different circuits may be integrated in the first wafer WF1 and the second wafer WF2. For example, pixel arrays may be formed in the first wafer WF1 and other circuits may be formed in the second wafer WF2. Even though FIG. 20 illustrates the vertical stacking of the two wafers WF1 and WF2 (e.g., wafer WF1 is stacked on wafer WF2), three or more wafers may be stacked vertically.

After the integrated circuits are formed in the first and second wafers WF1 and WF2, the first wafer WF1 and the second wafer WF2 are bonded. The bonded wafers WF1 and WF2 are cut and divided into a plurality of chips where each chip corresponds to a semiconductor device including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to a second semiconductor die SD2.

According to example embodiments, each semiconductor device 100 may include a plurality of semiconductor dies SD1 and SD2 that are stacked in the vertical direction. The semiconductor dies include central regions and peripheral regions surrounding the central regions, respectively. A plurality of semiconductor integrated circuits are formed in the central regions of the semiconductor dies, respectively. A three-dimensional crack detection structure is formed in a ring shape in the peripheral regions of the semiconductor dies to surround the central regions. The three-dimensional crack detection structure is expanded in the vertical direction to cover the plurality of semiconductor dies SD1 and SD2.

In some example embodiments, the three-dimensional crack detection structure may include a single conduction loop, such as described with reference to the example of FIG. 3. In other example embodiments, the three-dimensional crack detection structure may include two conduction loops, such as described with reference to the example of FIG. 14. Even though example embodiments will be described with reference to FIGS. 21 and 22 for a single conduction loop LOOPa covering a plurality of semiconductor dies SD1 and SD2, it should be understood that the two conduction loops LOOPc and LOOPd as illustrated in the example of FIG. 14 may be formed to cover the plurality of semiconductor dies SD1 and SD2.

FIGS. 21 and 22 are cross-sectional diagrams illustrating a vertical structure of a three-dimensional crack detection structure according to example embodiments.

Referring to FIG. 21, a first semiconductor die SD1 may include a first semiconductor substrate SUB1 and a first dielectric layer DLY1 in which upper structures of the first semiconductor substrate SUB1 are formed, and a second semiconductor die SD2 may include a second semiconductor substrate SUB2 and a second dielectric layer DLY2 in which upper structures of the second semiconductor substrate SUB2 are formed. Each of the first and second dielectric layers DLY1 and DLY2 may include a plurality of conduction layers. For example, the first dielectric layer DLY1 may include a first metal layer ML1 and a first polysilicon layer PL1, and the second dielectric layer DLY2 may include a second metal layer ML2 and a second polysilicon layer PL2. The metal layers ML1 and ML2 may be the uppermost metal layers in the respective dielectric layers DLY1 and DLY2. The polysilicon layers PL1 and PL2 may include a gate polysilicon layer in which gates of transistors in the semiconductor integrated circuits are formed. If the semiconductor integrated circuits include a semiconductor memory device, the polysilicon layers may further include a bitline polysilicon layer in which bitlines in the semiconductor integrated circuits are formed.

The conduction loop LOOPa may include a plurality of top horizontal line segments HLT formed in the first conduction layer ML1 of the first semiconductor die SD1 (that is, the uppermost semiconductor die in the stacked structure), a plurality of bottom horizontal line segments HLB formed in the second conduction layer PL2 of the second semiconductor die SD2 (that is, the lowest semiconductor die in the stacked structure) and a plurality of vertical line segments VL connecting the top horizontal line segments HLT and the bottom horizontal line segments HLB respectively to form the conduction loop LOOPa. The top horizontal line segments HLT and the bottom horizontal line segments HLB may be perpendicular to the vertical line segments VL, and the vertical line segments VL may provide an electrical connection between the top horizontal line segments HLT and the bottom horizontal line segments HLB.

In the embodiment of FIG. 21, the first conduction layer ML1 may correspond to an uppermost metal layer among the metal layer of the first semiconductor die SD1, and the second conduction layer PL2 may correspond to the polysilicon layer of the second semiconductor die SD2. The top horizontal line segments HLT may include metal line patterns MP1 formed in the metal layer ML1 of the first semiconductor die SD1, and the bottom horizontal line segments HLB may include polysilicon line patterns PP2 formed in the polysilicon layer PL2 of the second semiconductor die SD2.

The vertical line segments VL may include vertical contacts VC1, TSV and VC2 to connect the metal line patterns MP1 in the metal layer ML1 and the polysilicon line patterns PP in the polysilicon layer PL2. As illustrated in FIG. 21, the vertical contacts TSV may include the through-substrate vias TSV penetrating the first semiconductor substrate SUB1 of the first semiconductor die SD1. The vertical line segments VL may further include conduction line patterns PP1 and MP2 respectively formed in the intermediate conduction layers PL1 and ML2.

Referring to FIG. 22, a first semiconductor die SD1 may include a first semiconductor substrate SUB1 and a first dielectric layer DLY1 in which upper structures of the first semiconductor substrate SUB1 are formed, and a second semiconductor die SD2 may include a second semiconductor substrate SUB2, a second dielectric layer DLY2 in which upper structures of the second semiconductor substrate SUB2 are formed, and a metal later MLB on a bottom surface of the second semiconductor substrate SUB2. Each of the first and second dielectric layers DLY1 and DLY2 may include a plurality of conduction layers. For example, the first dielectric layer DLY1 may include a first metal layer ML1 and a first polysilicon layer PL1, and the second dielectric layer DLY2 may include a second metal layer ML2 and a second polysilicon layer PL2. The metal layers ML1 and ML2 may be the uppermost metal layers in the respective dielectric layers DLY1 and DLY2. The polysilicon layers PL1 and PL2 may include a gate polysilicon layer in which gates of transistors in the semiconductor integrated circuits are formed. If the semiconductor integrated circuits include a semiconductor memory device, the polysilicon layers may further include a bitline polysilicon layer in which bitlines in the semiconductor integrated circuits are formed.

The conduction loop LOOPa may include a plurality of top horizontal line segments HLT formed in the first conduction layer ML1 of the first semiconductor die SD1 (that is, the uppermost semiconductor die in the stacked structure), a plurality of bottom horizontal line segments HLB formed in the second conduction layer MLB of the second semiconductor die SD2 (that is, the lowest semiconductor die in the stacked structure) and a plurality of vertical line segments VL connecting the top horizontal line segments HLT and the bottom horizontal line segments HLB respectively to form the conduction loop LOOPa. The top horizontal line segments HLT and the bottom horizontal line segments HLB may be perpendicular to the vertical line segments VL, and the vertical line segments VL may provide an electrical connection between the top horizontal line segments HLT and the bottom horizontal line segments HLB.

In the embodiment of FIG. 22, the first conduction layer ML1 may correspond to an uppermost metal layer among the metal layer of the first semiconductor die SD1, and the second conduction layer PL2 may correspond to the metal layer on the bottom surface of the second semiconductor die SD2. The top horizontal line segments HLT may include metal line patterns MP1 formed in the metal layer ML1 of the first semiconductor die SD1, and the bottom horizontal line segments HLB may include metal line patterns MPB formed in the metal layer MLB on the bottom surface of the second semiconductor die SD2.

The vertical line segments VL may include vertical contacts VC1, TSV1, VC2 and TSV2 to connect the metal line patterns MP1 in the metal layer ML1 and the metal line patterns MPB in the metal layer MLB. As illustrated in FIG. 22, the vertical contacts TSV may include the through-substrate vias TSV1 and TSV2 penetrating the first semiconductor substrate SUB1 and the second semiconductor substrate SUB2, respectively. The vertical line segments VL may further include conduction line patterns PP1, MP2 and PP2 respectively formed in the intermediate conduction layers PL1, ML2 and PL2.

As described with reference to FIGS. 21 and 22, the three-dimensional crack detection structure CDST according to example embodiments may be expanded in the vertical direction Z to the various depths. Using the three-dimensional crack detection structure CDST, the crack penetration of various types may be detected thoroughly.

Figure 23:
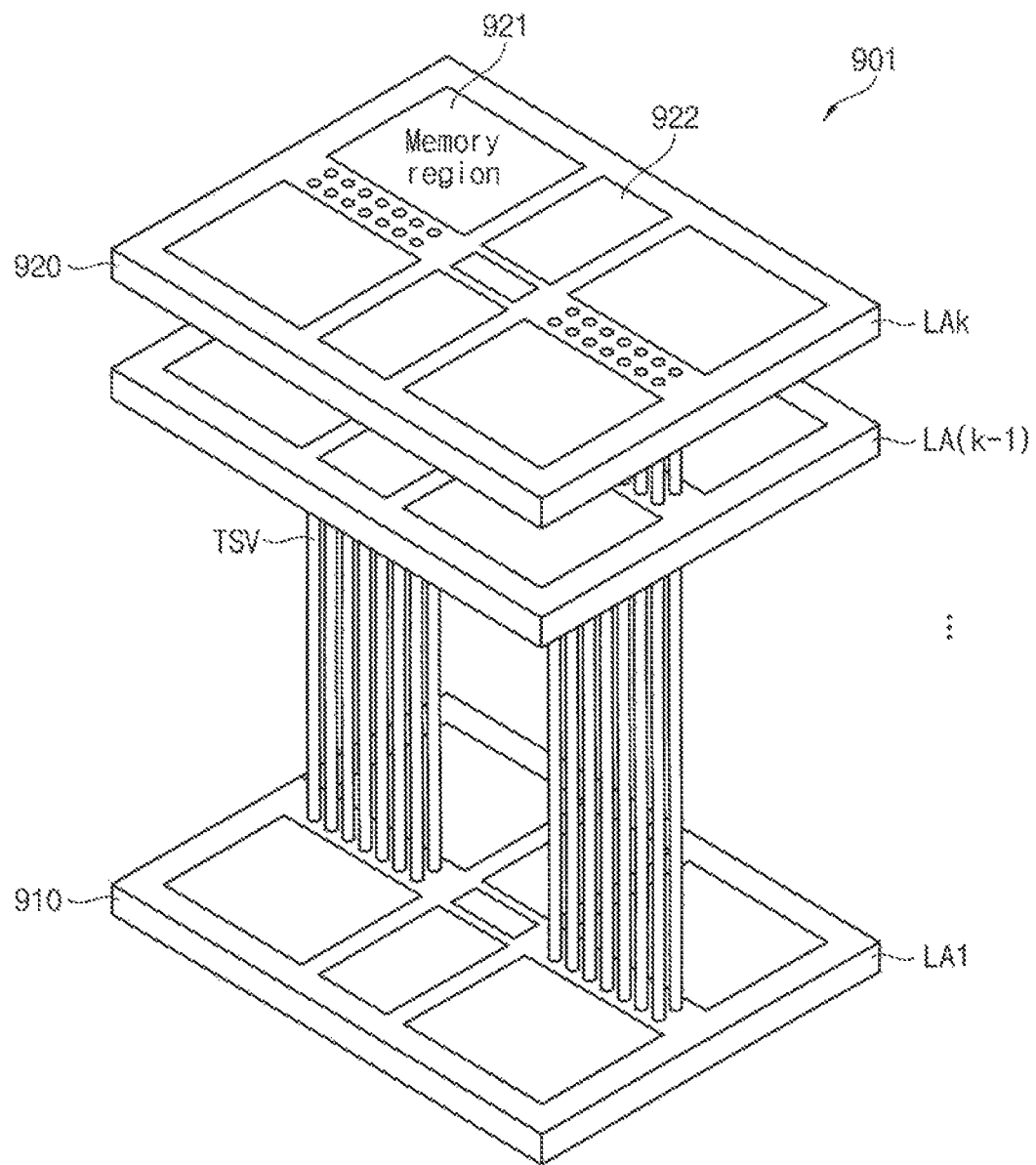
FIG. 23 is a structural diagram illustrating a semiconductor memory device according to example embodiments.

FIG. 23 is a structural diagram illustrating a semiconductor memory device according to example embodiments.

Referring to FIG. 23, a semiconductor memory device 901 may include first through kth semiconductor integrated circuit layers LA1 through LAk (e.g., integrated circuit layer LA1, integrated circuit layer LA2 (not shown), . . . , integrated circuit layer LAk-1, integrated circuit layer LAk, in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals between the layers by through-substrate vias TSVs (e.g., through-silicon vias). The lowest first semiconductor integrated circuit layer LA1 as the interface or control chip may communicate with an external memory controller through a conductive structure formed on an external surface.

Each of the first semiconductor integrated circuit layer 910 through the kth semiconductor integrated circuit layer 920 may include memory regions 921 and peripheral circuits 922 for driving the memory regions 921. For example, the peripheral circuits 922 may include a row-driver for driving wordlines of a memory, a column-driver for driving bit lines of the memory, a data input/output circuit for controlling input/output of data, a command buffer for receiving a command from outside and buffering the command, and an address buffer for receiving an address from outside and buffering the address.

The first semiconductor integrated circuit layer 910 may further include a control circuit. The control circuit may control an access to the memory region 921 based on a command and an address signal from a memory controller and may generate control signals for accessing the memory region 921.

The first semiconductor integrated circuit layer 910 through the kth semiconductor integrated circuit layer 920 may include the three-dimensional crack detection structure according to example embodiments, as described above. The three-dimensional crack detection structure may be expanded in the vertical direction to the various depths. The three-dimensional crack detection structure may be formed in the peripheral region to surround the central region of the first semiconductor integrated circuit layer 910 through the kth semiconductor integrated circuit layer 920. Using the three-dimensional crack detection structure, the crack penetration of various types may be detected thoroughly.

Figure 24:
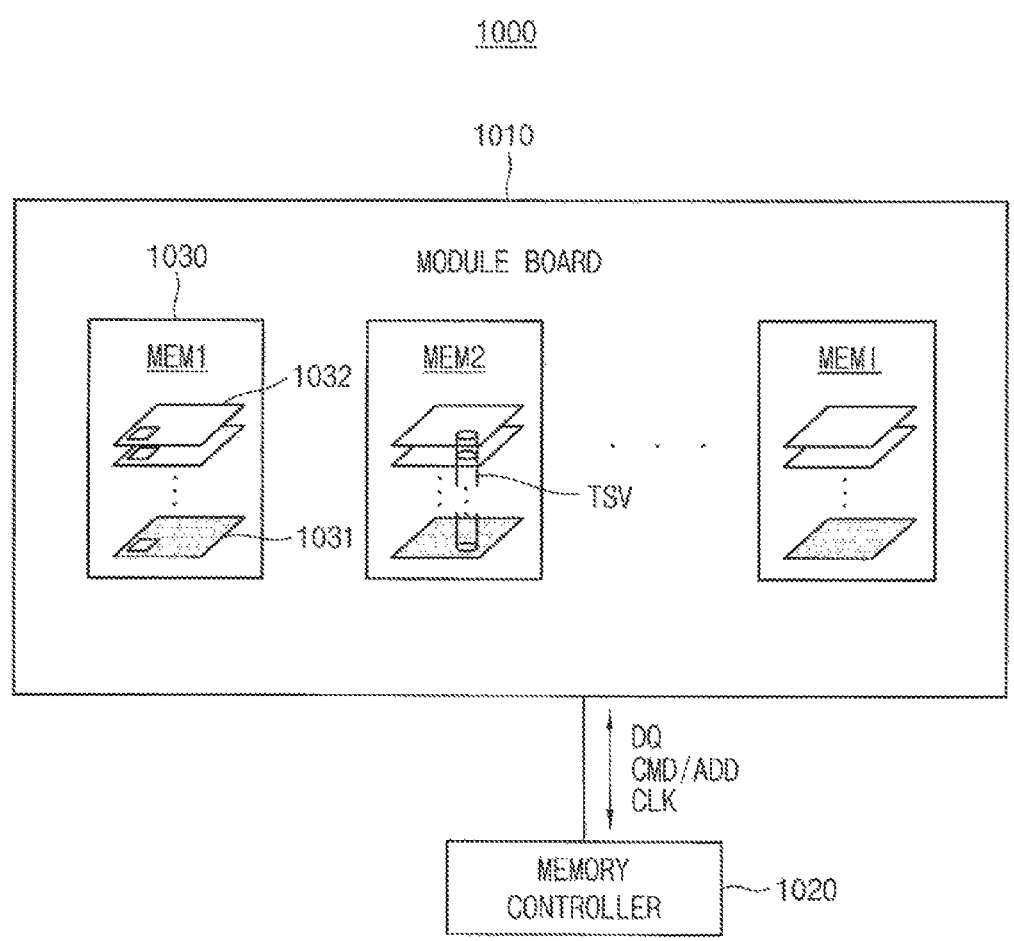
FIG. 24 is a block diagram illustrating a memory system according to example embodiments.

FIG. 24 is a block diagram illustrating a memory system according to example embodiments.

Referring to FIG. 24, a memory system 1000 may include a memory module 1010 and a memory controller 1020. The memory module 1010 may include at least one semiconductor memory device MEM1 1030 mounted on a module board. For example, the semiconductor memory device 1030 may be constructed as a DRAM chip or a flash memory chip. In addition, the semiconductor memory device 1030 may include a stack of semiconductor chips. In this case, the semiconductor chips may include at least one master chip 1031 and at least one slave chip 1032. As illustrated by the exemplary semiconductor memory device MEM2, signal transfer between the semiconductor chips may be performed via through-substrate vias (e.g., through-silicon vias TSV) and/or bonding wires.

The memory module 1010 may communicate with the memory controller 1020 via a system bus. Data DQ, a command/address CMD/ADD, and a clock signal CLK may be transmitted and received between the memory module 1010 and the memory controller 1020 via the system bus.

At least one of the memory module 1010 and the memory controller 1020 may include a three-dimensional crack detection structure according to example embodiments, as described above. Using the three-dimensional crack detection structure, the crack penetration of various types may be detected more thoroughly.

Figure 25:
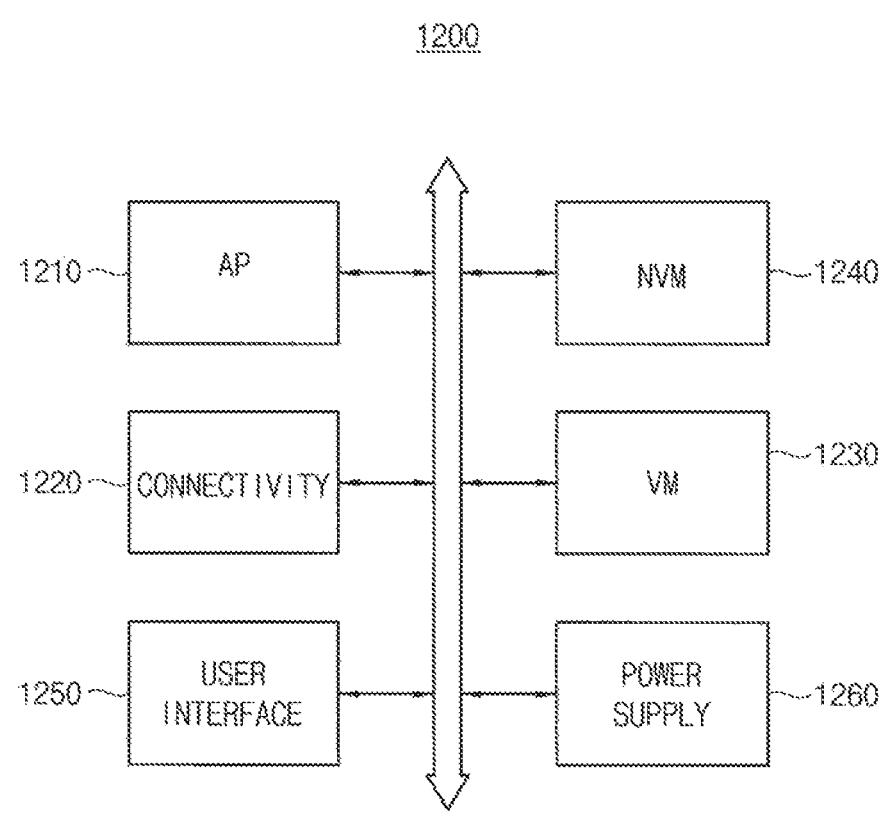
FIG. 25 is a block diagram illustrating a mobile system according to example embodiments.

FIG. 25 is a block diagram illustrating a mobile system according to example embodiments.

Referring to FIG. 25, a mobile system 1200 includes an application processor 1210, connectivity circuit 1220, a volatile memory device (VM) 1230, a nonvolatile memory device (NVM) 1240, a user interface 1250, and a power supply 1260. In some example embodiments, the mobile system 1200 may be a mobile phone, a smart phone, a personal digital assistant (PDA), a portable multimedia player (PMP), a digital camera, a music player, a portable game console, a navigation system, or another type of electronic device.

The application processor 1210 may execute computer instructions stored in computer-readable media (e.g., memory devices), including applications such as a web browser, a game application, a video player, etc. In some example embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some example embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some example embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), wafer-level processed stack package (WSP), etc.

At least one of the application processor 1210, the connectivity unit 1220, the volatile memory device 1230, the nonvolatile memory device 1240 and the user interface 1250 may include the three-dimensional crack detection structure according to example embodiments, as described above. Using the three-dimensional crack detection structure, the crack penetration of various types may be detected thoroughly.

Figure 26:
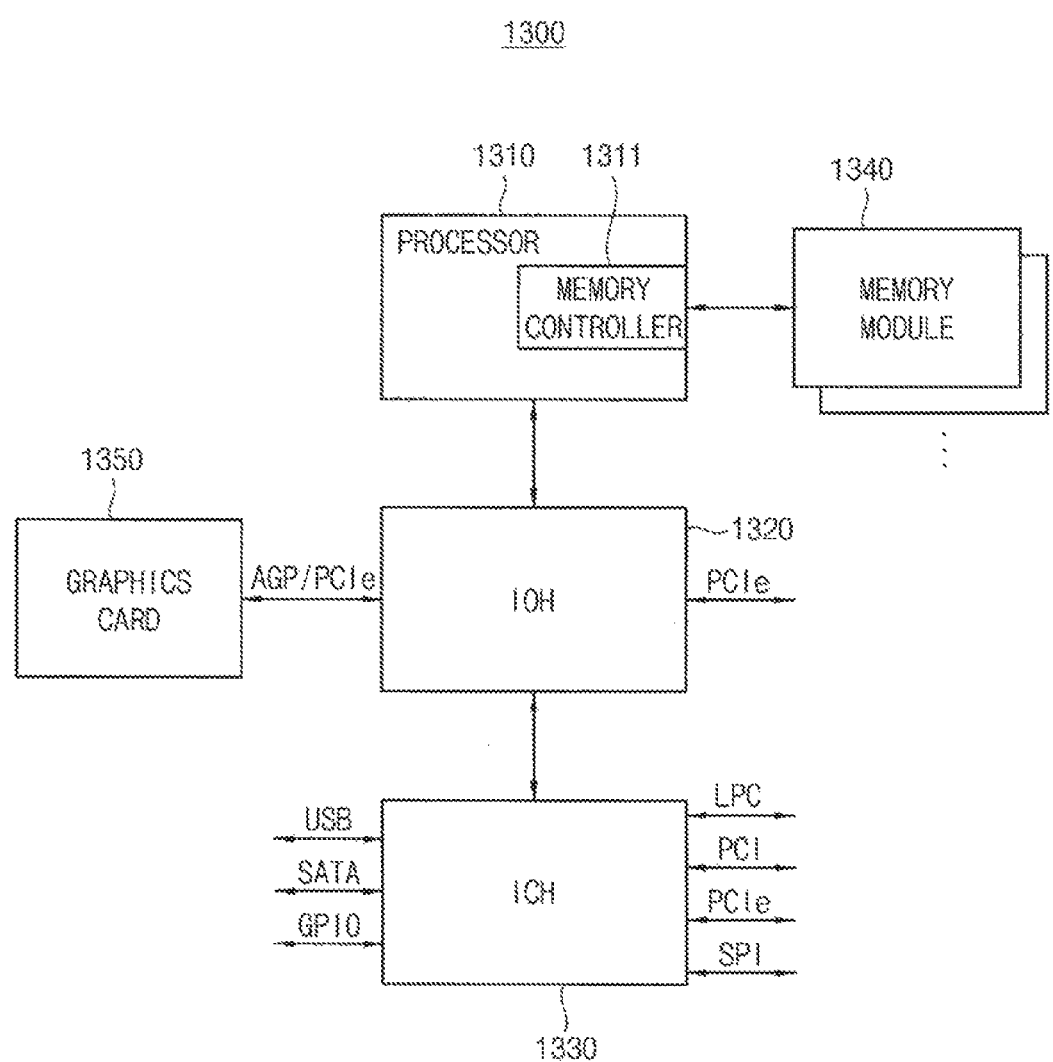
FIG. 26 is a block diagram illustrating a computing system according to example embodiments.

FIG. 26 is a block diagram illustrating a computing system according to example embodiments.

Referring to FIG. 26, a computing system 1300 includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1310 may perform various computing functions such as executing specific software for performing specific calculations or tasks. For example, the processor 1310 may be a microprocessor, a central processor unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 26 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320, which may be referred to as memory controller hub (MCH).

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a Quick-Path interconnect (QPI), a common system interface (CSI), etc. Although FIG. 26 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some example embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other example embodiments, at least two of the processor 1310, the input/output hub 1320 and the input/output controller hub 1330 may be implemented as a single chipset. Also, while many features of the example embodiments are disclosed as units, in other embodiments those features may be implemented as other forms of logic including but not limited to code-based operations performed by a processor.

At least one of the processor 1310, the input/output hub 1320, the input/output controller hub 1330, the memory module 1340, and the graphics card 1350 may include an adaptive repair circuit according to at least one example embodiment as described above. Using the adaptive repair circuit, the failed signal path in the signal paths between the various components may be repaired efficiently.

The three-dimensional crack detection structure according to example embodiments may be applied to arbitrary devices and systems formed in at least one semiconductor die. For example, the example embodiments may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
a semiconductor die including a central region and a peripheral region surrounding the central region;
a semiconductor integrated circuit formed in the central region; and
a three-dimensional crack detection structure formed in the peripheral region to surround the central region, the three-dimensional crack detection structure extending in a vertical direction that is perpendicular to a row direction and a column direction,
wherein the semiconductor die includes a first conduction layer and a second conduction layer below the first conduction layer,
wherein the three-dimensional crack detection structure includes a conduction loop that extends in the vertical direction between the first conduction layer and the second conduction layer,
wherein the conduction loop includes a plurality of top horizontal line segments formed in the first conduction layer, a plurality of bottom horizontal line segments formed in the second conduction layer, and a plurality of vertical line segments connecting the top horizontal line segments and the bottom horizontal line segments to form the conduction loop,
wherein the first conduction layer comprises a metal layer that is formed above a semiconductor substrate of the semiconductor die,
wherein the second conduction layer comprises a polysilicon layer that is formed between the semiconductor substrate and the metal layer, and
wherein each of the plurality of bottom horizontal line segments is shorter than each of the plurality of top horizontal line segments.

2. The semiconductor device of claim 1, wherein the top horizontal line segments include metal line patterns formed in the metal layer,
wherein the bottom horizontal line segments include polysilicon line patterns formed in the polysilicon layer, and
wherein the vertical line segments include vertical contacts connecting the metal line patterns and the polysilicon line patterns to form the conduction loop.

3. The semiconductor device of claim 1, wherein the first conduction layer comprises an uppermost metal layer among a plurality of metal layers that are formed above a semiconductor substrate of the semiconductor die.

4. The semiconductor device of claim 1, wherein the second conduction layer comprises a gate polysilicon layer in which gates of transistors of a semiconductor integrated circuit are formed.

5. The semiconductor device of claim 1, wherein the second conduction layer comprises a bitline polysilicon layer in which bitlines of a semiconductor integrated circuit are formed.

6. The semiconductor device of claim 1, wherein the conduction loop includes at least one repeater configured to receive an input signal, amplify the input signal, and output an amplified signal.

7. A semiconductor device comprising:
a plurality of semiconductor dies stacked in a vertical direction, each of the semiconductor dies including a central region and a peripheral region surrounding the central region;
a plurality of semiconductor integrated circuits respectively formed in the central regions of the semiconductor dies; and
a three-dimensional crack detection structure formed in a ring shape in the peripheral regions of the semiconductor dies to surround the central regions, the three-dimensional crack detection structure extending in the vertical direction to cover the plurality of semiconductor dies,
wherein the three-dimensional crack detection structure comprises a conduction loop that includes a plurality of top horizontal line segments formed in an uppermost semiconductor die of the plurality of semiconductor dies, a plurality of bottom horizontal line segments formed in a lowermost semiconductor die of the plurality of semiconductor dies, and a plurality of vertical line segments each connecting a top horizontal line segment in the uppermost semiconductor die to a bottom horizontal line segment in the lowermost semiconductor die to form the conduction loop.

8. The semiconductor device of claim 7, wherein the plurality of top horizontal line segments are formed in a first conduction layer of the uppermost semiconductor die, and
wherein the plurality of bottom horizontal line segments are formed in a second conduction layer of the lowermost semiconductor die.

9. A semiconductor device comprising:
a semiconductor die including a first conduction layer, a second conduction layer below the first conduction layer, a third conduction layer below the second conduction layer, and a central region and a peripheral region surrounding the central region;
a semiconductor integrated circuit formed in the central region; and
a three-dimensional crack detection structure formed in a ring shape in the peripheral region to surround the central region, the three-dimensional crack detection structure extending in a vertical direction that is perpendicular to a row direction and a column direction,
wherein the three-dimensional crack detection structure includes a first conduction loop that extends in the vertical direction between the second conduction layer and the third conduction layer and a second conduction loop formed in the first conduction layer.

10. The semiconductor device of claim 9, wherein the first conduction loop includes:
a plurality of top horizontal line segments formed in the second conduction layer;
a plurality of bottom horizontal line segments formed in the third conduction layer; and
a plurality of vertical line segments connecting the top horizontal line segments and the bottom horizontal line segments to form the first conduction loop.

11. The semiconductor device of claim 10, wherein the second conduction layer comprises a metal layer that is formed above a semiconductor substrate of the semiconductor die and the top horizontal line segments include metal line patterns formed in the metal layer, and
wherein the third conduction layer comprises a polysilicon layer that is formed between the semiconductor substrate and the metal layer and the bottom horizontal line segments include polysilicon line patterns formed in the polysilicon layer.

12. The semiconductor device of claim 11, wherein the top horizontal line segments include metal line patterns formed in the metal layer,
wherein the bottom horizontal line segments include polysilicon line patterns formed in the polysilicon layer, and
wherein the vertical line segments include vertical contacts connecting the metal line patterns and the polysilicon line patterns to form the first conduction loop.

13. The semiconductor device of claim 12, wherein each of the plurality of bottom horizontal line segments is shorter than each of the plurality of top horizontal line segments.

14. The semiconductor device of claim 9, wherein the first conduction layer and the second conduction layer comprise metal layers that are formed above a semiconductor substrate of the semiconductor die, and
wherein the third conduction layer comprises a polysilicon layer that is formed between the semiconductor substrate and the metal layers.

15. The semiconductor device of claim 9, wherein the first conduction layer and the second conduction layer respectively comprise first and second metal layers that are formed above a semiconductor substrate of the semiconductor die, and
wherein the third conduction layer comprises a third metal layer that is formed on a bottom surface of the semiconductor substrate.

16. The semiconductor device of claim 9, wherein the second conduction layer comprises a metal layer that is formed above a semiconductor substrate of the semiconductor die, and
wherein the third conduction layer comprises a polysilicon layer that is formed between the semiconductor substrate and the metal layer.

* * * * *